United States Patent
Honda et al.

(10) Patent No.: US 8,698,214 B2
(45) Date of Patent: Apr. 15, 2014

(54) SEMICONDUCTOR DEVICE

(71) Applicant: Semiconductor Energy Laboratory Co., Ltd., Atsugi (JP)

(72) Inventors: Tatsuya Honda, Isehara (JP); Masashi Tsubuku, Atsugi (JP); Yusuke Nonaka, Atsugi (JP); Takashi Shimazu, Nagoya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/654,864

(22) Filed: Oct. 18, 2012

(65) Prior Publication Data

US 2013/0105865 A1    May 2, 2013

(30) Foreign Application Priority Data

Oct. 27, 2011  (JP) ................. 2011-235636

(51) Int. Cl.
*H01L 27/085*  (2006.01)
(52) U.S. Cl.
USPC .................... 257/255; 257/E29.296
(58) Field of Classification Search
USPC .......................... 257/255, E29.296
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |

(Continued)

FOREIGN PATENT DOCUMENTS

| | | |
|---|---|---|
| CN | 101794820 | 8/2010 |
| CN | 101796644 | 8/2010 |

(Continued)

OTHER PUBLICATIONS

Nakayama et al., "17a-TL-8 Effect of GaO Layer on IGZO-TFT Channel,", Extended Abstracts (The 57th Spring Meeting 2010), The Japan Society of Applied Physics and Related Societies, Mar. 17, 2010, pp. 21-008.

(Continued)

*Primary Examiner* — Kimberly Rizkallah
*Assistant Examiner* — Timor Karimy
(74) *Attorney, Agent, or Firm* — Eric J. Robinson; Robinson Intellectual Property Law Office, P.C.

(57) ABSTRACT

A semiconductor device includes a base insulating film including silicon, an oxide semiconductor film over the base insulating film, a gate insulating film over the oxide semiconductor film, a gate electrode which is in contact with the gate insulating film and overlaps with at least the oxide semiconductor film, and a source electrode and a drain electrode electrically connected to the oxide semiconductor film. The oxide semiconductor film includes a region in which a concentration of silicon distributed from the interface with the base insulating film toward an inside of the oxide semiconductor film is lower than or equal to 1.0 at. %. A crystal portion is included at least in the region.

16 Claims, 27 Drawing Sheets

(56) References Cited

U.S. PATENT DOCUMENTS

| | | |
|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,471 B2 | 5/2012 | Iwasaki et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0072469 A1 | 3/2010 | Yamazaki et al. |
| 2010/0092800 A1 | 4/2010 | Itagaki et al. |
| 2010/0109002 A1 | 5/2010 | Itagaki et al. |
| 2010/0181565 A1 | 7/2010 | Sakata et al. |
| 2010/0187523 A1 | 7/2010 | Sakata et al. |
| 2010/0258794 A1 | 10/2010 | Iwasaki et al. |
| 2010/0320458 A1 | 12/2010 | Umeda et al. |
| 2010/0320459 A1 | 12/2010 | Umeda et al. |
| 2011/0140098 A1 | 6/2011 | Akimoto et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |
| 2013/0082262 A1 | 4/2013 | Honda et al. |
| 2013/0082263 A1 | 4/2013 | Honda et al. |
| 2013/0092944 A1 | 4/2013 | Honda et al. |
| 2013/0092945 A1 | 4/2013 | Honda et al. |
| 2013/0105791 A1 | 5/2013 | Honda et al. |

FOREIGN PATENT DOCUMENTS

| | | |
|---|---|---|
| CN | 102160105 | 8/2011 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2008-311342 A | 12/2008 |
| JP | 2009-081413 A | 4/2009 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-097212 A | 4/2010 |
| JP | 2010-177431 A | 8/2010 |
| JP | 2010-186994 A | 8/2010 |
| JP | 2010-192881 A | 9/2010 |
| JP | 4571221 | 10/2010 |
| JP | 2011-096884 A | 5/2011 |
| JP | 2011-142315 A | 7/2011 |
| JP | 2011-205017 A | 10/2011 |
| JP | 2012-160679 A | 8/2012 |
| KR | 2010-0061511 A | 6/2010 |
| KR | 2010-0084466 A | 7/2010 |

(56) References Cited

FOREIGN PATENT DOCUMENTS

| KR | 2011-0076916 A | 7/2011 |
|---|---|---|
| WO | WO-2004/114391 | 12/2004 |
| WO | WO-2008/133345 | 11/2008 |
| WO | WO-2009/031634 | 3/2009 |
| WO | WO-2010/032639 | 3/2010 |
| WO | WO-2011/070887 | 6/2011 |

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu,or Zn] At Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Kamiya et al., "Carrier Transport Properties and Electronic Structures of Amorphous Oxide Semiconductors: the present status," Solid State Physics, Sep. 1, 2009, vol. 44, No. 9, pp. 621-633, AGNE Gijutsu Center.

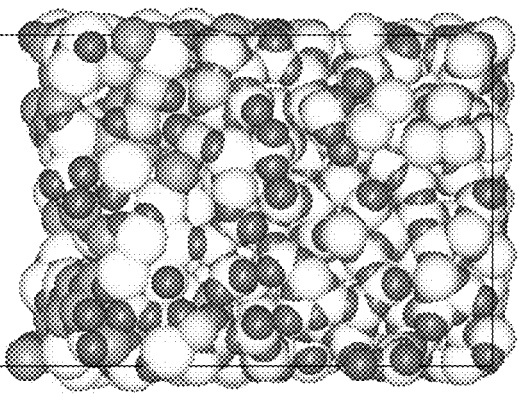
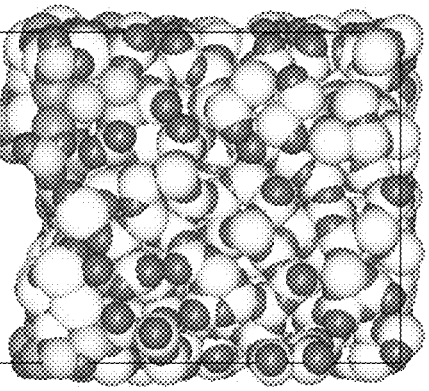

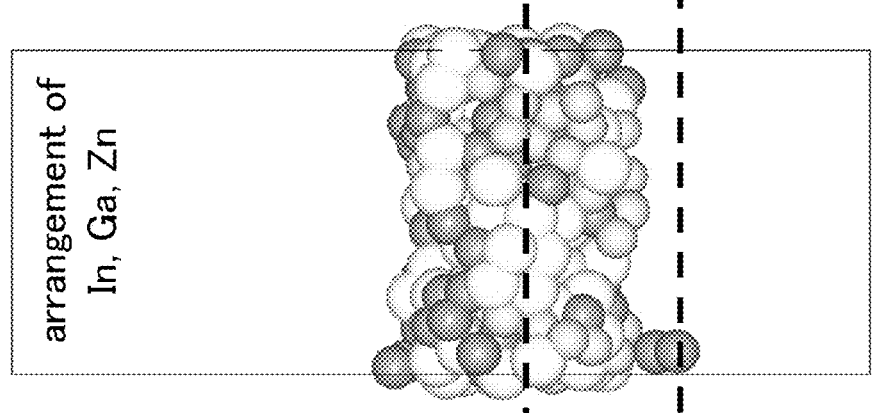
FIG. 21C arrangement of In, Ga, Zn
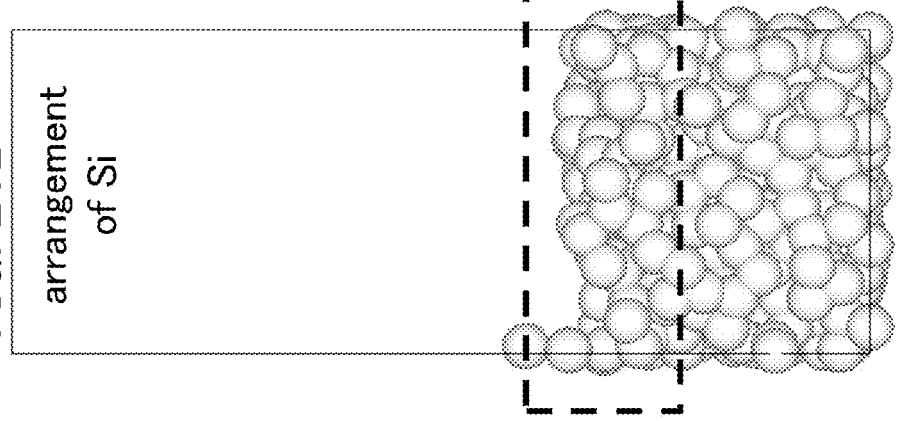
FIG. 21B arrangement of Si
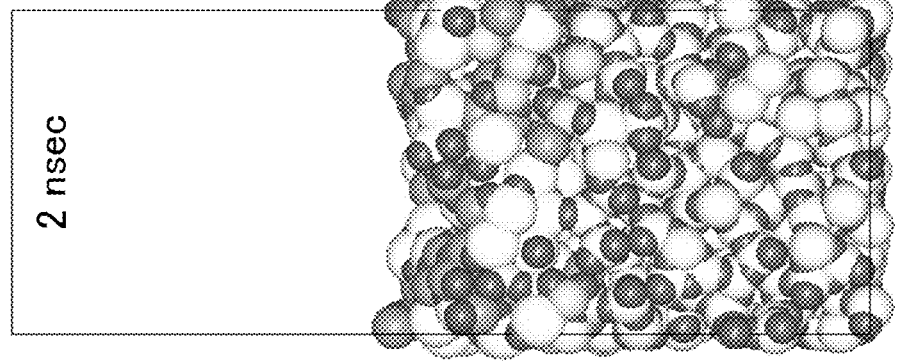
FIG. 21A 2 nsec

SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and an electronic device are all semiconductor devices.

2. Description of the Related Art

A technique for forming a transistor with the use of a semiconductor thin film formed over a substrate having an insulating surface has attracted attention. The transistor is applied to a wide range of electronic devices such as an integrated circuit (IC) or an image display device (display device). For example, a silicon-based semiconductor material is widely known as a material for a semiconductor thin film applicable to a transistor. Besides, an oxide semiconductor has attracted attention.

For example, a transistor whose active layer includes an amorphous oxide including indium (In), gallium (Ga), and zinc (Zn) is disclosed (see Patent Document 1).

Transistors including oxide semiconductors have on-state characteristics (e.g., on-state current) superior to those of transistors including amorphous silicon. In order to apply the transistors including oxide semiconductors to high-performance devices, such transistors are required to have further improved characteristics, and thus techniques of crystallization of oxide semiconductors have been developed (see Patent Document 2). In Patent Document 2, a technique in which an oxide semiconductor is crystallized by heat treatment is disclosed.

REFERENCE

Patent Documents

[Patent Document 1] Japanese Published Patent Application No. 2006-165528
[Patent Document 2] Japanese Published Patent Application No. 2008-311342

SUMMARY OF THE INVENTION

An oxide semiconductor film used in a transistor is formed by a sputtering method in many cases. When the oxide semiconductor film is formed by sputtering, in some cases, an ionized rare gas element (e.g., argon) or an element ejected from a surface of a target flicks off a constituent element of a film, such as a base insulating film, on which the oxide semiconductor film is to be formed (the film is also referred to as "formed film"). Elements flicked off from the formed film are taken into the oxide semiconductor film as an impurity element. In particular, the oxide semiconductor film in the vicinity of a surface of the formed film (the surface is also referred to as "formed film surface") might have high concentration of the impurity element. Further, when the impurity element is left in the oxide semiconductor film, the resistance of the oxide semiconductor film is increased, which leads to a decrease in on-state current or field-effect mobility, which is one of electric characteristics of a transistor.

Furthermore, the impurity element included in the oxide semiconductor film in the vicinity of the formed film surface inhibits crystallization of the oxide semiconductor film. As a result, an amorphous region is left in the oxide semiconductor film in the vicinity of the formed film surface.

The following countermeasure can be considered: the oxide semiconductor film is made thick, and a crystal region formed in a surface layer is used as a channel formation region. However, the thickness of the oxide semiconductor film affects the threshold voltage which is one of transistor characteristics. In the transistor including the oxide semiconductor film, the oxide semiconductor film is preferably thin so that the threshold voltage is made to be shifted in a positive direction, for example.

In view of the above problem, an object is to reduce the concentration of impurities included in an oxide semiconductor film in the vicinity of a formed film surface. Further, an object is to improve crystallinity of the oxide semiconductor film in the vicinity of the formed film surface. Further, an object is to provide a semiconductor device having favorable electric characteristics with the use of the oxide semiconductor film.

In order to reduce the concentration of impurities included in the oxide semiconductor film in the vicinity of the formed film surface, it is effective to reduce energy of a constituent element of the oxide semiconductor film when colliding with the formed film surface. For example, for achieving the above, a method in which the power of deposition by sputtering is low and/or a method in which the pressure of deposition by sputtering is high can be used in the case where the oxide semiconductor film is formed over a base insulating film by a sputtering method. In the oxide semiconductor film formed by such a method, a region in which the concentration of impurities is reduced is formed from the interface with the base insulating film toward the oxide semiconductor film. Details thereof are described below.

An embodiment of the disclosed invention is a semiconductor device including a base insulating film including silicon, an oxide semiconductor film formed over the base insulating film, a gate insulating film formed over the oxide semiconductor film, a gate electrode which is in contact with the gate insulating film and overlaps with at least the oxide semiconductor film, and a source electrode and a drain electrode electrically connected to the oxide semiconductor film. The oxide semiconductor film includes a first region in which a concentration of silicon distributed from an interface with the base insulating film toward an inside of the oxide semiconductor film is lower than or equal to 1.0 at. %. At least the first region includes a crystal portion.

In the above structure, the first region may be formed to be in contact with the interface with the base insulating film and have a thickness less than or equal to 5 nm Further, the oxide semiconductor film may include a crystal portion in a second region. The c-axis of the crystal portion may be aligned in the direction parallel to a normal vector of a surface of the base insulating film.

In each of the above structures, a silicon concentration of the first region may be lower than or equal to 0.1 at. %. Further, a carbon concentration of the first region may be lower than or equal to $1.0 \times 10^{20}$ atoms/cm$^3$.

When the oxide semiconductor film in the vicinity of the base insulating film has the above silicon concentration and carbon concentration, suppression of an increase in resistance of the oxide semiconductor film or improvement of crystallinity of the oxide semiconductor film can be achieved. As a result, the semiconductor device can have stable electric characteristics.

According to an embodiment of the disclosed invention, the concentration of impurity included in the oxide semiconductor film in the vicinity of the base insulating film can be reduced. In addition, crystallinity of the oxide semiconductor film in the vicinity of the base insulating film can be improved. Thus, a semiconductor device with stable electric characteristics can be provided.

BRIEF DESCRIPTION OF THE DRAWINGS

In the accompanying drawings:

FIGS. 20A to 20C are models used for calculation;

FIGS. 21A to 21C are models used for calculation;

DETAILED DESCRIPTION OF THE INVENTION

Figure 1A:
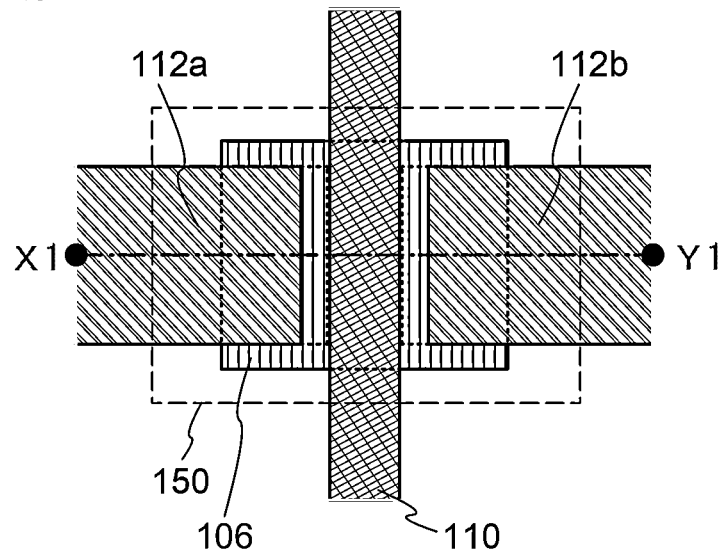
FIGS. 1A and 1B are a plan view and a cross-sectional view illustrating an embodiment of a semiconductor device.

Hereinafter, embodiments and examples of the invention disclosed in this specification will be described with reference to the accompanying drawings. Note that the present invention is not limited to the following description and it will be easily understood by those skilled in the art that modes and details can be modified in various ways without departing from the spirit and the scope of the present invention. Therefore, the present invention should not be construed as being limited to the description in the following embodiments and examples.

Note that the position, the size, the range, or the like of each structure illustrated in drawings and the like is not accurately represented in some cases for easy understanding. Therefore, the disclosed invention is not necessarily limited to the position, the size, the range, or the like as disclosed in the drawings and the like.

In this specification and the like, ordinal numbers such as "first", "second", and "third" are used in order to avoid confusion among components, and the terms do not limit the components numerically.

Note that in this specification and the like, the term such as "over" or "below" does not necessarily mean that a component is placed "directly on" or "directly under" another component. For example, the expression "a gate electrode over a gate insulating film" can mean the case where there is an additional component between the gate insulating film and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

(Embodiment 1)

In this embodiment, an embodiment of a semiconductor device and a method for manufacturing the semiconductor device will be described with reference to FIGS. 1A and 1B, FIGS. 2A to 2D, and FIGS. 3A to 3C.

<Structure Example of Semiconductor Device>

Figure 1B:
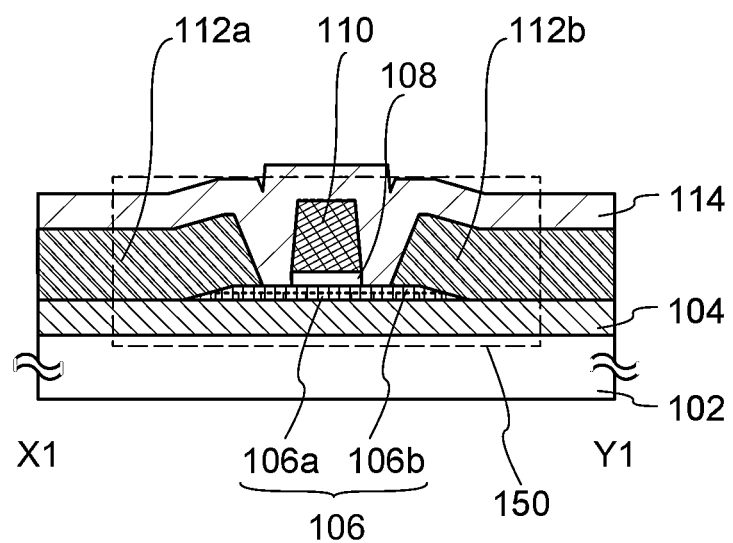

FIGS. 1A and 1B are a plan view and a cross-sectional view of a top-gate transistor as an example of a semiconductor device. FIG. 1A is a plan view and FIG. 1B is a cross-sectional view taken along line X1-Y1 in FIG. 1A. Note that in FIG. 1A, some of components of a transistor 150 (e.g., a gate insulating film 108) are omitted for brevity.

The transistor 150 illustrated in FIGS. 1A and 1B includes an oxide semiconductor film 106 which includes a region 106a and a region 106b and is formed over a base insulating film 104, the gate insulating film 108 formed over the oxide semiconductor film 106, a gate electrode 110 which is in contact with the gate insulating film 108 and overlaps with at least the oxide semiconductor film 106, and a source electrode 112a and a drain electrode 112b electrically connected to the oxide semiconductor film 106. An insulating film 114 is formed over the transistor 150.

The thickness of the oxide semiconductor film 106 is greater than 5 nm and less than or equal to 200 nm, preferably greater than or equal to 10 nm and less than or equal to 30 nm. Further, the oxide semiconductor film 106 preferably has a structure with crystallinity, such as a single crystal structure, a polycrystalline structure, or a microcrystalline structure.

Further, in this embodiment, the oxide semiconductor film 106 is preferably a c-axis aligned crystalline oxide semiconductor (CAAC-OS) film. Note that the CAAC-OS film is to be described later in detail in description of a method for manufacturing the transistor 150.

As illustrated in FIG. 1B, an end portion of the oxide semiconductor film 106 is preferably tapered at an angle of 20° to 50°. When the oxide semiconductor film 106 has a perpendicular end portion, oxygen is easily released from the end portion of the oxide semiconductor film 106 and thus oxygen vacancies are likely to be generated. When the oxide semiconductor film 106 has a tapered end portion, generation of oxygen vacancies is suppressed, and thus generation of leakage current of the transistor 150 can be reduced.

The base insulating film 104 preferably has a function of preventing diffusion of an impurity element such as hydrogen or moisture from a substrate 102 and a function of supplying oxygen to the oxide semiconductor film 106. For example, an insulating film including silicon, such as a silicon oxide film, is preferably used as the base insulating film 104. Further, the base insulating film 104 may have a single-layer structure including silicon or a stacked structure including two or more of layers of an insulating film including a constituent element other than silicon and an insulating film including silicon. Note that it is preferable that a silicon oxide film serving as the base insulating film 104 be provided in contact with the oxide semiconductor film 106. This is because the silicon oxide film can favorably supply oxygen to the oxide semiconductor film 106.

"Supplying oxygen from the base insulating film 104 to the oxide semiconductor film 106" means that, for example, part of oxygen is released by heating the base insulating film 104 and the released oxygen is supplied to the oxide semiconductor film 106 to fill oxygen vacancies in the oxide semiconductor film 106. In particular, the base insulating film 104 preferably contains oxygen at an amount which exceeds at least that in the stoichiometric composition. For example, a silicon oxide film of $SiO_{2+\alpha}$ ($\alpha>0$) is preferably used as the base insulating film 104. When such a silicon oxide film is used as the base insulating film 104, oxygen can be supplied to the oxide semiconductor film 106, so that the transistor 150 including the oxide semiconductor film 106 can have favorable transistor characteristics.

However, in the case of using a silicon oxide film as the base insulating film 104, silicon in the base insulating film 104 might be taken into the oxide semiconductor film 106 as an impurity. When silicon or the like is taken into the oxide semiconductor film 106 as an impurity, the resistance of the oxide semiconductor film 106 is increased, which leads to a decrease in on-state current or field-effect mobility, which is one of electric characteristics of a transistor.

Further, when an impurity element is taken into the oxide semiconductor film 106 in the vicinity of the surface on which the oxide semiconductor film 106 is formed (formed film surface), crystallization of the oxide semiconductor film 106 is inhibited by the impurity element. Thus, an amorphous region is left in the oxide semiconductor film 106 in the vicinity of the formed film surface. In addition, in the case where the oxide semiconductor film 106 is a CAAC-OS film, it is difficult to form a crystal portion in the vicinity of the formed film surface.

Change in structure of the oxide semiconductor film 106 when silicon (Si) is added as an impurity was examined by classical molecular dynamics calculation. The results thereof are described with reference to FIGS. 14A and 14B, FIGS. 15A and 15B, and FIG. 16. Note that simulation software "SCIGRESS ME" manufactured by Fujitsu Limited was used for classical molecular dynamics calculation. An empirical potential which characterizes the interatomic interaction is defined in the classical molecular dynamics method, so that force that acts on each atom is evaluated. Newton's equation of motion is numerically solved, whereby motion (time-dependent change) of each atom can be deterministically tracked.

Hereinafter, calculation models and calculation conditions are described. Note that in this calculation, the Born-Mayer-Huggins potential was used.

A single crystal structure of $InGaZnO_4$ consisting of 1680 atoms (see FIG. 14A) and a structure of $InGaZnO_4$ consisting of 1680 atoms in which 20 atoms of each of In, Ga, and Zn are substituted by silicon (Si) atoms (see FIG. 14B) were formed as calculation models. In the model of Si substitution shown in FIG. 14B, silicon atoms are included at 3.57 at. % (2.34 wt. %). Further, the density of the model of the single crystal shown in FIG. 14A is 6.36 g/cm$^3$, and the density of the model of Si substitution shown in FIG. 14B is 6.08 g/cm$^3$.

Figure 14A:
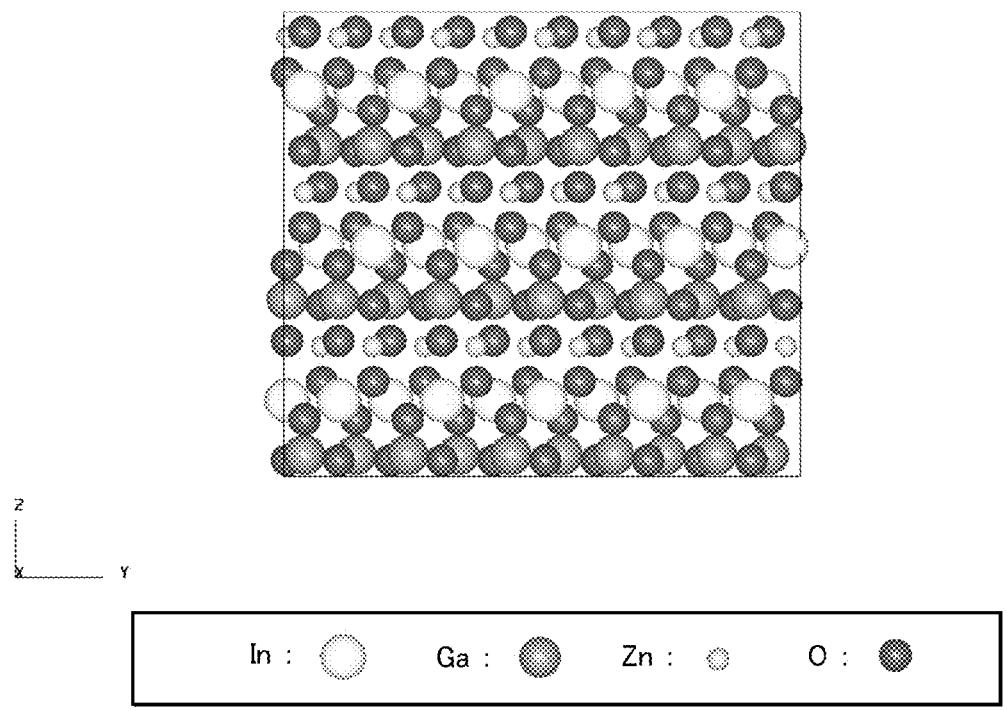
FIGS. 14A and 14B are models used for calculation.
Figure 14B:
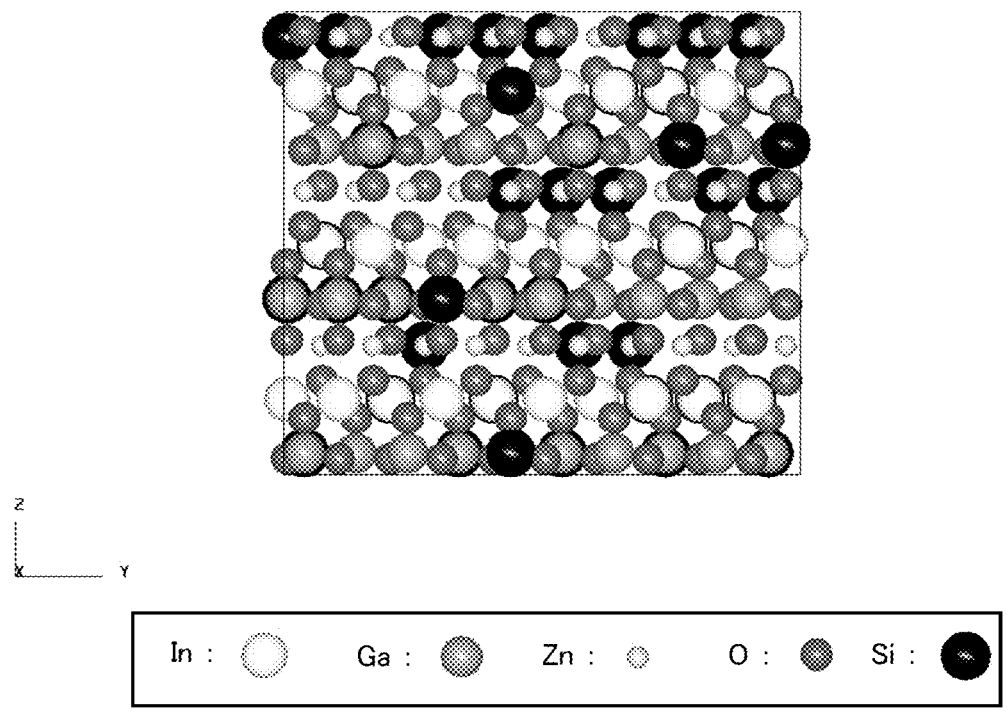

At 1727° C. which is lower than the melting point of the $InGaZnO_4$ single crystal (about 2000° C. according to estimation by the classical molecular dynamics calculation), structure relaxation was performed on the calculation models shown in FIGS. 14A and 14B by the classical molecular dynamics calculation at a fixed pressure (1 atom) for 150 psec (time step width 0.2 fsec×750000 steps). The radial distribution functions g(r) of the two structures were calculated. Note that the radial distribution function g(r) is a function representing the probability density of atoms existing at a distance of r from one atom. As the correlation between atoms disappears, g(r) becomes closer to 1.

Figure 15A:
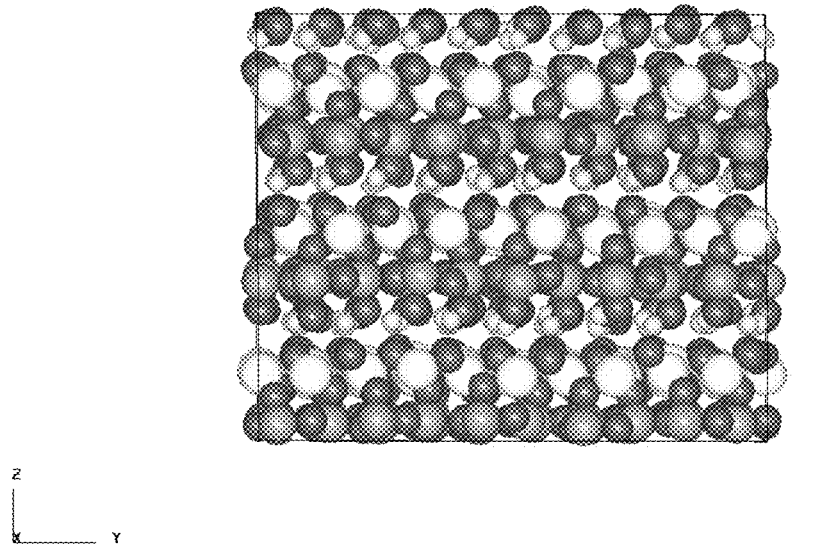
FIGS. 15A and 15B are models used for calculation.
Figure 15B:
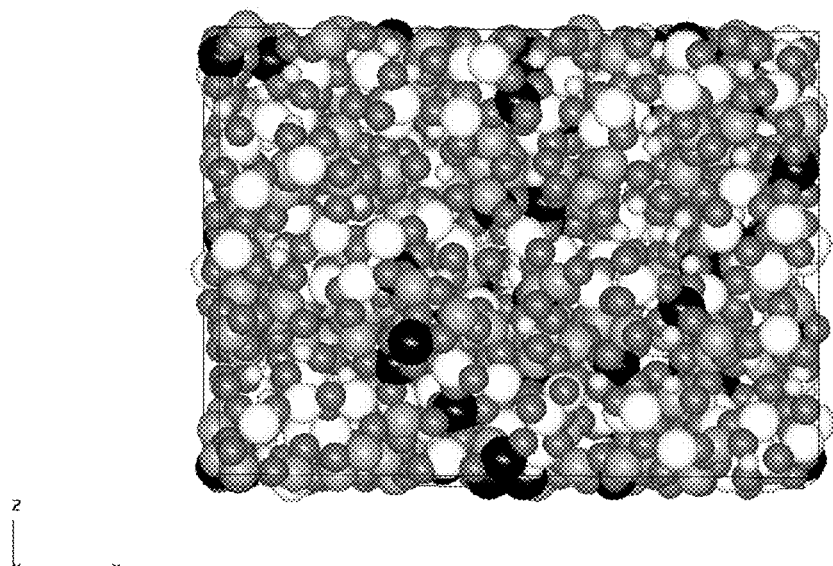
Figure 16:
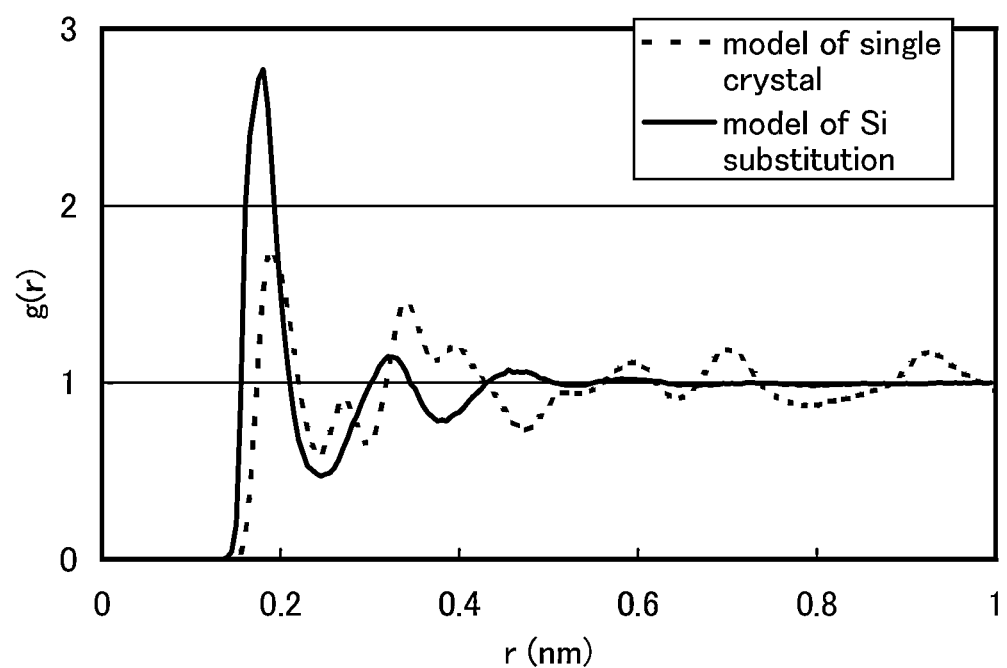
FIG. 16 shows calculation results.

FIGS. 15A and 15B show final structures obtained by performing the classical molecular dynamics calculation for 150 psec on the above two calculation models. In addition, FIG. 16 shows the radial distribution function g(r) in each structure.

The model of single crystal shown in FIG. 15A is stable and keeps the crystal structure even in the final structure, whereas the model of Si substitution shown in FIG. 15B is unstable, and it can be observed that the crystal structure is distorted with time and changes into an amorphous structure. When the radial distribution functions g(r) of the structural models are compared with each other in FIG. 16, it is found that the single crystal model has peaks even at a long distance and has a long-range order. On the other hand, it is found that in the model of Si substitution, the peak disappears at a distance about 0.6 nm, and the model of Si substitution does not have the long-range order.

The above calculation results indicate that when silicon (Si) is included in $InGaZnO_4$, $InGaZnO_4$ is likely to become amorphous. Further, according to the above results, even when $InGaZnO_4$ including silicon (Si) is heated at high temperature, such $InGaZnO_4$ is not crystallized.

Next, change in structure of the oxide semiconductor film 106 when carbon atoms (C) are added was examined by classical molecular dynamics calculation. The results thereof are described with reference to FIG. 14A, FIG. 15A, FIGS. 17A and 17B, and FIG. 18. Note that simulation software "SCIGRESS ME" manufactured by Fujitsu Limited was used for classical molecular dynamics calculation.

Hereinafter, calculation models and calculation conditions are described. Note that in this calculation, the Born-Mayer-Huggins potential was used. Further, for the interatomic interaction with a carbon atom (C), a Lennard-Jones potential was used.

A single crystal structure of $InGaZnO_4$ consisting of 1680 atoms (see FIG. 14A) and a structure of $InGaZnO_4$ consisting of 1680 atoms in which 20 atoms of each of In, Ga, and Zn are substituted by carbon atoms (C) and 80 atoms of oxygen (O) are substituted by carbon atoms (C) (see FIG. 17A) were formed as calculation models. In the model of C substitution shown in FIG. 17A, carbon atoms (C) are included at 8.33 at. %. Further, the density of the model of the single crystal shown in FIG. 14A is 6.36 g/cm$^3$, and the density of the model of C substitution shown in FIG. 17A is 5.89 g/cm$^3$.

Figure 17A:
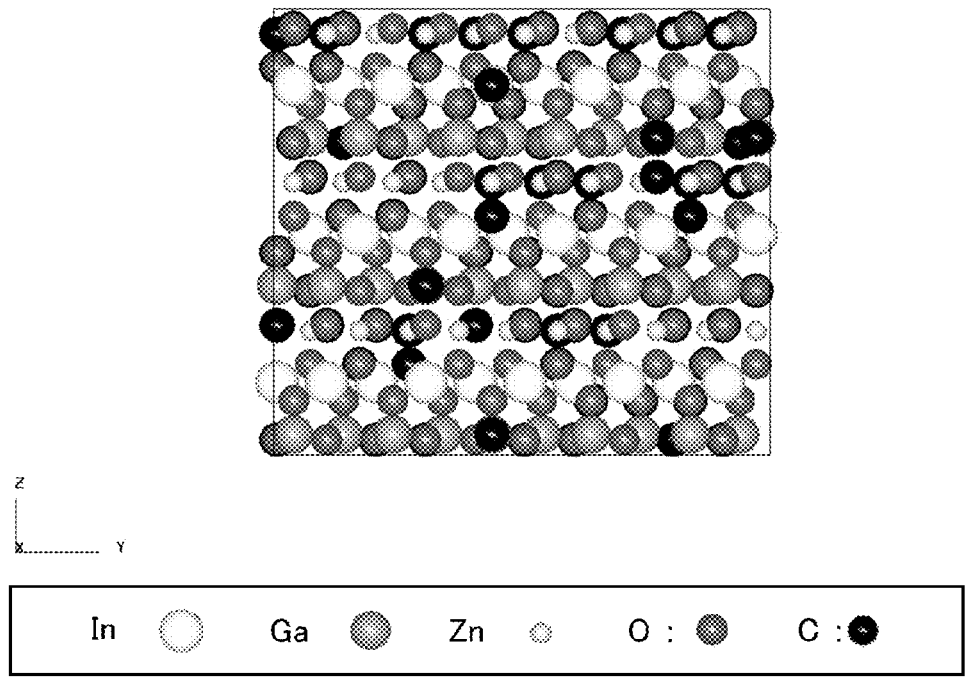
FIGS. 17A and 17B are models used for calculation.

At 1727° C. which is lower than the melting point of the $InGaZnO_4$ single crystal (about 2000° C. according to estimation by the classical molecular dynamics calculation), structure relaxation was performed on the calculation models shown in FIG. 14A and FIG. 17A by the classical molecular dynamics calculation at a fixed pressure (1 atom) for 150 psec (time step width 0.2 fsec×750000 steps). The radial distribution functions g(r) of the two structures were calculated. Note that the radial distribution function g(r) is a function representing the probability density of atoms existing at a distance of r from one atom. As the correlation between atoms disappears, g(r) becomes closer to 1.

Figure 17B:
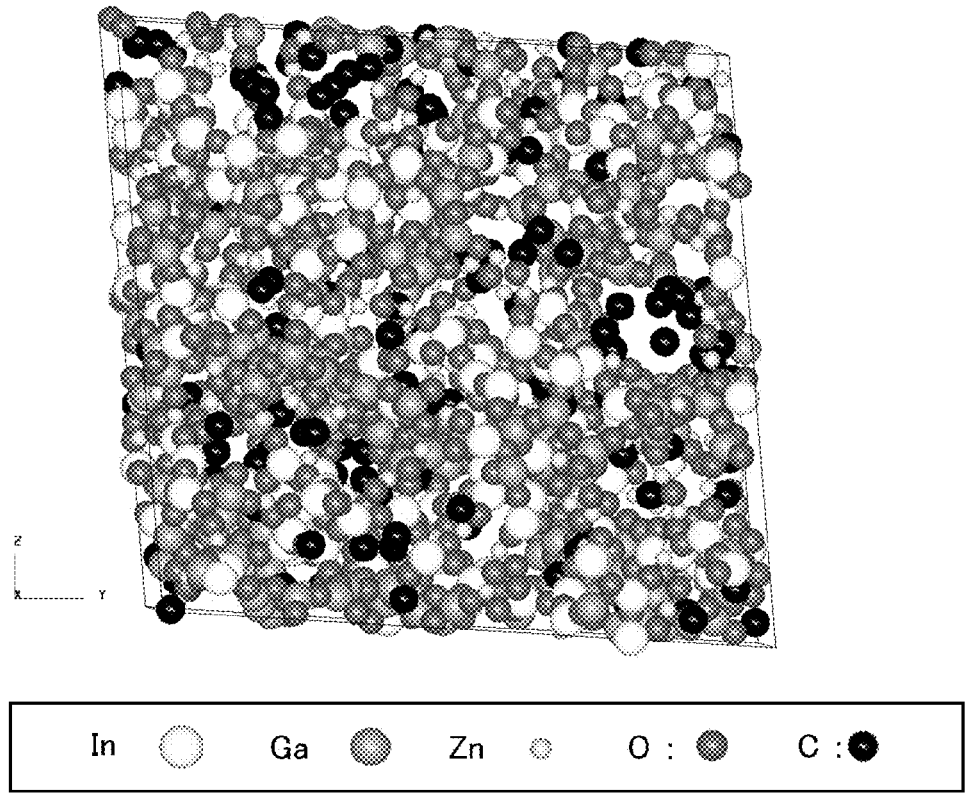
Figure 18:
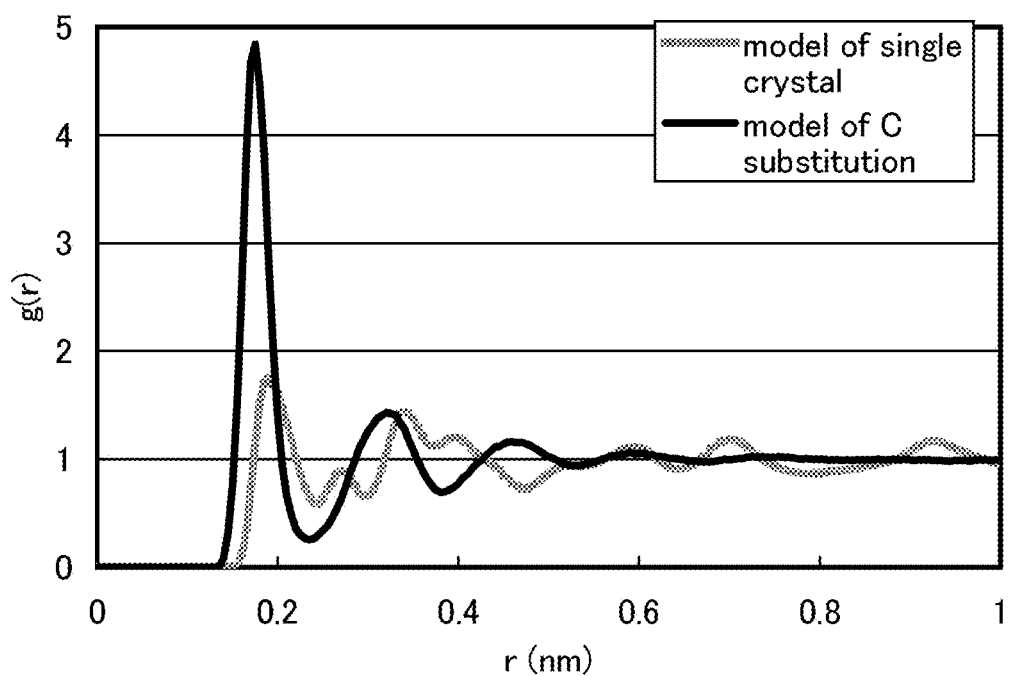
FIG. 18 shows calculation results.

FIG. 15A and FIG. 17B show final structures obtained by performing the classical molecular dynamics calculation for 150 psec on the above two calculation models. The radial distribution function g(r) in each structure is shown in FIG. 18.

The model of single crystal shown in FIG. 15A is stable and keeps the crystal structure even in the final structure, whereas the model of C substitution shown in FIG. 17B is unstable, and it can be observed that the crystal structure is distorted with time and changes into an amorphous structure. As seen in FIG. 18, by comparing the radial distribution functions g(r) of the structural models with each other, it is found that the model of single crystal has peaks even at a long distance and the long-range order. On the other hand, it is found that in the model of C substitution, the peak disappears at a distance about 0.7 nm, and the model of C substitution does not have the long-range order.

The above calculation results indicate that when carbon (C) is included in $InGaZnO_4$, $InGaZnO_4$ is likely to become amorphous. In addition, according to the above results, even when $InGaZnO_4$ including carbon (C) is heated at high temperature, such $InGaZnO_4$ is not crystallized.

Thus, when an impurity such as silicon or carbon is taken into an oxide semiconductor film, crystallization of the oxide semiconductor film is inhibited. Therefore, in the semiconductor device described in this embodiment, a region which has low concentration of an impurity such as silicon or carbon is provided.

Specifically, the oxide semiconductor film 106 in FIG. 1B includes a region 106a which is in contact with the interface with the base insulating film 104 and has a thickness of 5 nm or less and a region 106b which is a region other than the region 106a.

As described above, the concentration of an impurity such as silicon or carbon taken into the region 106a in the oxide semiconductor film 106 is reduced, whereby change in electric characteristics of the transistor 150 can be suppressed. Further, in the case where the oxide semiconductor film 106 is a CAAC-OS film, a crystal portion can be formed even in the vicinity of the interface with the base insulating film 104.

When the transistor 150 using the oxide semiconductor film 106 is manufactured, a semiconductor device with stable electric characteristics can be obtained.

Note that the details of the other components of the transistor are described in description of a method for manufacturing the transistor 150 below, with reference to FIGS. 2A to 2D and FIGS. 3A to 3C.

<Method for Manufacturing Transistor 150>

An example of a method for manufacturing the transistor 150 illustrated in FIGS. 1A and 1B, which is an embodiment of the present invention, will be described with reference to FIGS. 2A to 2D and FIGS. 3A to 3C.

First, the substrate 102 is prepared. There is no particular limitation on a substrate that can be used as the substrate 102 as long as it has at least heat resistance to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium or the like; an SOI substrate; or the like can be used.

A flexible substrate may alternatively be used as the substrate 102. When a flexible substrate is used, a transistor including the oxide semiconductor film 106 may be directly formed over the flexible substrate. Alternatively, a transistor including the oxide semiconductor film 106 may be formed over a manufacturing substrate, and then, the transistor may be separated and transferred to a flexible substrate. Note that in order to separate the transistor from the manufacturing substrate and transfer it to the flexible substrate, a separation layer may be provided between the manufacturing substrate and the transistor including the oxide semiconductor film 106.

Figure 2A:
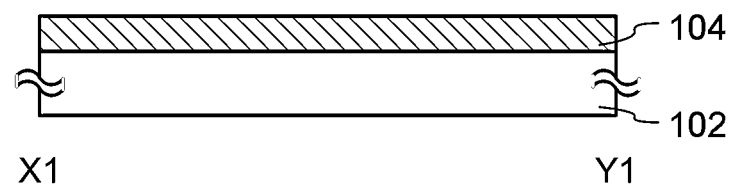
FIGS. 2A to 2D are cross-sectional views illustrating an example of a method for manufacturing a semiconductor device.
Figure 2B:
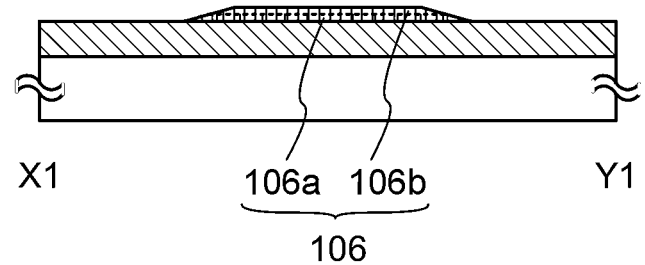

Next, the base insulating film 104 is formed over the substrate 102 (see FIG. 2A). The base insulating film 104 has an effect of preventing diffusion of an impurity element such as hydrogen or moisture from the substrate 102, and can be formed with a single-layer structure or a stacked-layer structure using one or more of insulating films including silicon, such as a silicon oxide film, a silicon nitride oxide film, and a silicon oxynitride film.

In addition, the base insulating film 104 has an effect of supplying oxygen to the oxide semiconductor film 106 to be formed later. For example, in the case where an insulating film including silicon, particularly a silicon oxide film is used as the base insulating film 104, part of oxygen can be released by heating the base insulating film 104; thus, oxygen can be supplied to the oxide semiconductor film 106 to fill oxygen vacancies in the oxide semiconductor film 106. In particular, the base insulating film 104 preferably contains oxygen at an amount which exceeds at least that in the stoichiometric composition. For example, a silicon oxide film of $SiO_{2+\alpha}$ ($\alpha>0$) is preferably used as the base insulating film 104. When such a silicon oxide film is used as the base insulating film 104, oxygen can be supplied to the oxide semiconductor film 106, so that the transistor 150 including the oxide semiconductor film 106 can have favorable transistor characteristics.

The substrate 102 may be subjected to plasma treatment or the like before the base insulating film 104 is formed. As plasma treatment, reverse sputtering in which an argon gas is introduced and plasma is generated can be performed, for example. The reverse sputtering is a method in which voltage is applied to the substrate 102 side with the use of an RF power source in an argon atmosphere and plasma is generated in the vicinity of the substrate 102 so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the substrate 102.

Next, an oxide semiconductor film is formed over the base insulating film 104 and a photolithography step and an etching step are performed. Thus, the oxide semiconductor film 106 is formed (see FIG. 2B). The oxide semiconductor film 106 is preferably a CAAC-OS film. Note that the base insulating film 104 and the oxide semiconductor film 106 are preferably formed successively without exposure to the air.

Here, the CAAC-OS film which can be used for the oxide semiconductor film 106 is described in detail.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm.

From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electric characteristics of the transistor due to irradiation with visible light or ultraviolet light can be reduced. Further, shift and variation of the threshold voltage can be suppressed. Thus, the transistor has high reliability.

In a crystalline oxide semiconductor layer, defects in the bulk can be further reduced. Further, when the surface flatness of the crystalline oxide semiconductor film is enhanced, a top-gate transistor including the oxide semiconductor can have higher field-effect mobility than a transistor including an amorphous oxide semiconductor. In order to improve the surface flatness of the oxide semiconductor film, the oxide semiconductor is preferably formed over a flat surface. Specifically, the oxide semiconductor may be formed over a surface with the average surface roughness (Ra) of less than or equal to 0.15 nm, preferably less than or equal to 0.1 nm.

Note that Ra is obtained by expanding arithmetic mean deviation, which is defined by JIS B 0601: 2001 (ISO4287: 1997), into three dimensions so as to be applicable to a curved surface. Moreover, Ra can be expressed as average value of the absolute values of deviations from a reference surface to a specific surface and is defined by the following formula.

$$Ra = \frac{1}{S_0} \int_{y_1}^{y_2} \int_{x_1}^{x_2} |f(x, y) - Z_0| dx dy \quad \text{[Formula 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the average height of the specific surface. Further, Ra can be measured with an atomic force microscope (AFM).

An oxide semiconductor used for the oxide semiconductor film 106 preferably contains at least indium (In) or zinc (Zn). In particular, In and Zn are preferably contained. As a stabilizer for reducing variation in electric characteristics of a transistor including the oxide semiconductor film, gallium (Ga) is preferably additionally contained. Tin (Sn) is preferably contained as a stabilizer. It is also preferable that one or more kinds of elements selected from hafnium (Hf), zirconium (Zr), titanium (Ti), scandium (Sc), yttrium (Y), and lanthanoid (e.g., cerium (Ce), neodymium (Nd), or gadolinium (Gd)) be contained as a stabilizer.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—

Zn-based oxide, an In—Sn—Hf—Zn-based oxide, and an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co, or the above-described element as a stabilizer. Alternatively, as the oxide semiconductor, a material represented by $In_2SnO_5(ZnO)_n$ (n>0, n is an integer) may be used.

For example, an In—Ga—Zn-based oxide with an atomic ratio of In:Ga:Zn=1:1:1, In:Ga:Zn=3:1:2, or In:Ga:Zn=2:1:3, or an oxide with an atomic ratio close to the above atomic ratios can be used.

It is preferable that hydrogen or water be contained in the oxide semiconductor film 106 as little as possible in the formation step of the oxide semiconductor film 106. For example, as pretreatment of the formation step of the oxide semiconductor film 106, it is preferable that the substrate 102 provided with the base insulating film 104 be preheated in a preheating chamber of a sputtering apparatus to remove and exhaust an impurity such as hydrogen or moisture adsorbed to the substrate 102 and the base insulating film 104. Further, the oxide semiconductor film 106 is preferably formed in a deposition chamber from which moisture has been exhausted.

In order to remove the moisture in the preheating chamber and the deposition chamber, an entrapment vacuum pump, for example, a cryopump, an ion pump, or a titanium sublimation pump is preferably used. Further, an evacuation unit may be a turbo pump provided with a cold trap. From the preheating chamber and the deposition chamber which are evacuated with a cryopump, a hydrogen atom, a compound containing a hydrogen atom such as water ($H_2O$) (more preferably, also a compound containing a carbon atom), and the like are removed, whereby the concentration of an impurity such as hydrogen or moisture in the oxide semiconductor film 106 can be reduced.

In this embodiment, an In—Ga—Zn-based oxide is formed as the oxide semiconductor film 106 by a sputtering method. The oxide semiconductor film 106 can be formed by a sputtering method in a rare gas (typically argon) atmosphere, an oxygen atmosphere, or a mixed atmosphere of a rare gas and oxygen.

As a target used in a sputtering method for forming an In—Ga—Zn-based oxide as the oxide semiconductor film 106, for example, a metal oxide target having an atomic ratio of In:Ga:Zn=1:1:1, a metal oxide target having an atomic ratio of In:Ga:Zn=3:1:2, or a metal oxide target having an atomic ratio of In:Ga:Zn=2:1:3 can be used, for example. Note that the target used for forming the oxide semiconductor film 106 is not limited to the targets including the above materials and having the above ratios.

Further, when the oxide semiconductor film 106 is formed using the above-described metal oxide target, the composition of the target is different from that of the thin film formed over the substrate in some cases. For example, when the metal oxide target having a composition ratio of $In_2O_3:Ga_2O_3:ZnO=1:1:1$ [molar ratio] is used, the composition ratio of the oxide semiconductor film 106, which is the thin film, becomes $In_2O_3:Ga_2O_3:ZnO=1:1:0.6$ to $1:1:0.8$ [molar ratio] in some cases, though it depends on the film formation conditions. This is because in formation of the oxide semiconductor film 106, ZnO is sublimed, or because a sputtering rate differs between the components of $In_2O_3$, $Ga_2O_3$, and ZnO.

Accordingly, when a thin film having a preferable composition ratio is formed, a composition ratio of the metal oxide target needs to be adjusted in advance. For example, in order to make the composition ratio of the thin oxide semiconductor film 106 be $In_2O_3:Ga_2O_3:ZnO=1:1:1$ [molar ratio], the composition ratio of the metal oxide target is made to be $In_2O_3:Ga_2O_3:ZnO=1:1:1.5$ [molar ratio]. In other words, the ZnO content of the metal oxide target is made higher in advance. The composition ratio of the target is not limited to the above value, and can be adjusted as appropriate depending on the film formation conditions or the composition of the thin film to be formed. Further, it is preferable to increase the ZnO content of the metal oxide target because in that case, the crystallinity of the obtained thin film is improved.

The relative density of the metal oxide target is higher than or equal to 90% and lower than or equal to 100%, preferably higher than or equal to 95% and lower than or equal to 99.9%. By using the metal oxide target with high relative density, the oxide semiconductor film 106 can be a dense film.

As a sputtering gas used for forming the oxide semiconductor film 106, it is preferable to use a high-purity gas from which an impurity such as hydrogen, water, a hydroxyl group, or hydride is removed.

There are three methods for forming a CAAC-OS film when the CAAC-OS film is used as the oxide semiconductor film 106. The first method is to form an oxide semiconductor film at a temperature higher than or equal to 100° C. and lower than or equal to 450° C. to form, in the oxide semiconductor film, a crystal portion in which a c-axis is aligned in the direction parallel to a normal vector of a surface where the oxide semiconductor film is formed or a normal vector of a surface of the oxide semiconductor film. The second method is to form an oxide semiconductor film with a small thickness and then heat it at a temperature higher than or equal to 200° C. and lower than or equal to 700° C., to form, in the oxide semiconductor film, a crystal portion in which a c-axis is aligned in the direction parallel to a normal vector of a surface where the oxide semiconductor film is formed or a normal vector of a surface of the oxide semiconductor film. The third method is to form a first oxide semiconductor film with a small thickness, then heat it at a temperature higher than or equal to 200° C. and lower than or equal to 700° C., and form a second oxide semiconductor film, to form, in the oxide semiconductor film, a crystal portion in which a c-axis is aligned in the direction parallel to a normal vector of a surface where the oxide semiconductor film is formed or a normal vector of a surface of the oxide semiconductor film.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 150° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol. % or higher, preferably 100 vol. %.

Note that when an oxide semiconductor film having crystallinity (single crystal or microcrystal) different from the CAAC-OS film is formed as the oxide semiconductor film 106, the film formation temperature is not particularly limited.

Note that in the case where the oxide semiconductor film 106 is formed by a sputtering method, when an element for forming the oxide semiconductor film 106 collides with the base insulating film 104, an element that is a constituent element of the base insulating film 104 enters the oxide semiconductor film 106. The entering phenomenon is referred to as mixing or a mixing effect in some cases in this specification and the like. In the oxide semiconductor film 106 in FIG. 2B, a region formed due to mixing is the region 106a and a region other than the region 106a is the region 106b.

Such mixing significantly occurs in the oxide semiconductor film 106 in the vicinity of the interface with the base insulating film 104, specifically occurs in the region 106a. When a constituent element of the base insulating film 104 enters the oxide semiconductor film 106, the resistance of the oxide semiconductor film 106 is increased, which might cause a decrease in on-state current or field-effect mobility, which is one of electric characteristics of a transistor. Further, in the case where the oxide semiconductor film 106 is a CAAC-OS film, the oxide semiconductor film 106 in the vicinity of the base insulating film 104 is prevented from being crystallized.

The possibility of mixing occurring in the vicinity of an interface between the base insulating film 104 and the oxide semiconductor film 106 when the oxide semiconductor film 106 is formed over the base insulating film 104 was examined by classical molecular dynamics calculation. Here, the results thereof are described with reference to FIG. 19, FIGS. 20A to 20C, and FIGS. 21A to 21C. Note that simulation software "SCIGRESS ME" manufactured by Fujitsu Limited was used for classical molecular dynamics calculation.

Figure 19:
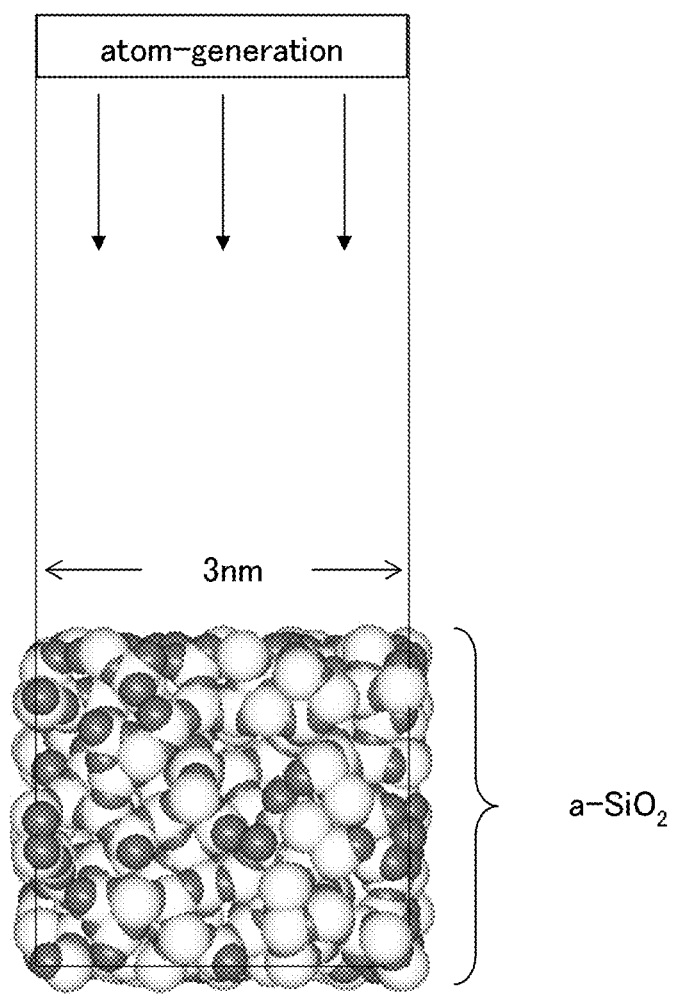
FIG. 19 is a model used for calculation.

A model shown in FIG. 19 was formed using an amorphous silicon oxide (hereinafter, referred to as a-$SiO_2$) film as a base insulating film. The size of a unit cell (a calculation unit cell) used in calculation is set to be 3 nm in the x-axis direction, 3 nm in the y-axis direction, and 7.5 nm in the z-axis direction. The x-axis and the y-axis refer to the directions parallel to the a-$SiO_2$ film, and the z-axis refers to the thickness direction of the a-$SiO_2$ film. Note that in the calculation, the periodic boundary condition is applied in the x-axis direction and the y-axis direction so that a film which is sufficiently large in the x-axis direction and the y-axis direction can be assumed.

Next, supposing that an IGZO (an oxide containing In, Ga, and Zn) film was formed over the a-$SiO_2$ film as the oxide semiconductor film, In, Ga, Zn, and O each of which has an energy of 1 eV and whose ratio is 1:1:1:4 (the total number of atoms is 840) were ejected from the upper portion (in FIG. 19, an atom-generation portion) over the a-$SiO_2$ film toward the lower portion, and classical molecular dynamics calculation was performed at a temperature of 300° C. for 2 nsec (time step width 0.2 fsec×ten million steps).

FIGS. 20A to 20C and FIGS. 21A to 21C show the calculation results. FIG. 20A shows arrangement of oxygen (O) atoms and silicon (Si) atoms at 0 sec; FIG. 20B shows arrangement of oxygen (O) atoms, silicon (Si) atoms, gallium (Ga) atoms, and zinc (Zn) atoms after 1 nsec; and FIG. 20C shows arrangement of oxygen (O) atoms, silicon (Si) atoms, gallium (Ga) atoms, and zinc (Zn) atoms after 2 nsec. FIG. 21A shows arrangement of oxygen (O) atoms, silicon (Si) atoms, gallium (Ga) atoms, and zinc (Zn) atoms after 2 nsec; FIG. 21B shows arrangement of only silicon (Si) atoms after 2 nsec; and FIG. 21C shows arrangement of indium (In) atoms, gallium (Ga) atoms, and zinc (Zn) atoms after 2 nsec.

By comparing the arrangement of only silicon (Si) atoms shown in FIG. 21B and the arrangement of indium (In) atoms, gallium (Ga) atoms, and zinc (Zn) atoms shown in FIG. 21C, it was confirmed that the indium (In) atoms, the gallium (Ga) atoms, and the zinc (Zn) atoms entered a layer of the silicon (Si) atoms.

The above calculation results indicate that by injecting indium (In) atoms, gallium (Ga) atoms, zinc (Zn) atoms, and oxygen (O) atoms, which have an energy of 1 eV, into the a-$SiO_2$ film, a layer in which silicon (Si) atoms, indium (In) atoms, gallium (Ga) atoms, zinc (Zn) atoms, and oxygen (O) atoms are mixed is formed between the a-$SiO_2$ film and an IGZO film.

According to the above results, in order to prevent formation of a layer in which the base insulating film 104 and the oxide semiconductor film 106 are mixed, it is effective to reduce energy of a constituent element of the oxide semiconductor film 106 when colliding with the base insulating film 104. For achieving the above, a method in which the power for deposition of the oxide semiconductor film 106 by a sputtering method is low or a method in which the pressure for deposition of the oxide semiconductor film 106 by a sputtering method is high can be used, for example. Alternatively, a distance between a target and a substrate over which the film is deposited (hereinafter, also referred to as a T-S distance) may be increased.

Note that mixing due to sputtering is likely to be caused in the oxide semiconductor film 106 in the vicinity of the interface with the base insulating film 104 as described above. Thus, the oxide semiconductor film in the vicinity of the interface is deposited by sputtering under the condition that the energy of a constituent element of the oxide semiconductor film 106 when colliding with the base insulating film 104 is low, and accordingly the mixing effect is reduced; after that, in performing the rest of deposition, the energy of collision may be increased.

For example, in the deposition of the oxide semiconductor film 106, the oxide semiconductor film in the vicinity of the interface with the base insulating film 104 may be deposited under the condition that the power for deposition of the oxide semiconductor film is low, and then, the deposition of the oxide semiconductor film may be carried on under the condition that the deposition power is increased. Alternatively, the oxide semiconductor film in the vicinity of the interface with the base insulating film 104 may be deposited under the condition that the pressure for deposition of the oxide semiconductor film is high, and then, the deposition of the oxide semiconductor film may be carried on under the condition that the deposition pressure is reduced. Further alternatively, the oxide semiconductor film in the vicinity of the interface with the base insulating film 104 may be deposited under the condition that the T-S distance (distance between a target and a substrate) is large, and then, the deposition of the oxide semiconductor film may be carried on under the condition that the T-S distance is decreased.

The specific value of the deposition power is 5 kW or lower, preferably 1 kW or lower, further preferably 500 W or lower, furthermore preferably 200 W or lower. However, as the deposition power is reduced, the deposition rate of the oxide semiconductor film 106 is decreased. Further, in the case where the deposition power is significantly low, plasma is less likely to be generated in a sputtering apparatus, and the possibility that normal deposition treatment cannot be performed is increased. Thus, it is preferable that the deposition power be higher than or equal to 5% of the maximum power that can be applied in the sputtering apparatus. In considering a reduction in the deposition power, a practitioner may select the optimum power value as appropriate in terms of performance of the sputtering apparatus or the thickness of the oxide semiconductor film 106 so that deposition can be normally performed, as long as the manufacturing process of the transistor 150 (cycle time) is not significantly affected by the deposition time.

The specific value of the deposition pressure is 0.4 Pa or higher, preferably 1.0 Pa or higher, further preferably 2.0 Pa or higher, furthermore preferably 5.0 Pa or higher. However, as the deposition pressure is increased, quality of a film that is to be deposited tends to deteriorate (e.g., the film is sparse). Thus, it is preferable that the deposition pressure be 100 Pa or lower. In considering an increase in the deposition pressure, a practitioner may select the optimum pressure value as appropriate in terms of characteristics necessary for the oxide semiconductor film 106 (e.g., field-effect mobility or the like).

The specific value of the T-S distance is 30 mm or more, preferably 50 mm or more, further preferably 100 mm or more, furthermore preferably 300 mm or more. Note that as the T-S distance is increased, the deposition rate of the oxide semiconductor film 106 is decreased. Thus, it is preferable that the T-S distance be 500 mm or less. In considering an increase in the T-S distance, a practitioner may select the optimum T-S distance as appropriate as long as the manufacturing process of the transistor 150 (cycle time) is not significantly affected by the deposition time.

Note that in order to reduce the energy of a constituent element of the oxide semiconductor film 106 when colliding with the base insulating film 104, the oxide semiconductor film 106 may be deposited in a state where one or more of the conditions of deposition power, deposition pressure, and T-S distance are set in the above range.

In the case where as the sputtering apparatus, a magnetron-type sputtering apparatus in which a target (target used for depositing the oxide semiconductor film 106) and a substrate over which a film is to be deposited are set in substantially parallel to each other (simply the apparatus is also called a magnetron sputtering apparatus) is used, besides a constituent element of the oxide semiconductor film 106, plasma, a secondary electron, or the like collides with the base insulating film 104; thus, it can be said that a constituent element of the base insulating film 104 is very likely to enter the oxide semiconductor film 106. Therefore, as a sputtering apparatus used for depositing the oxide semiconductor film 106, a facing-target-type sputtering apparatus (also called a mirrortron sputtering apparatus) may be used. In the sputtering apparatus, two targets are set to face each other, and a substrate over which a film is to be deposited is set in a portion other than a space sandwiched between the two targets to be in a direction substantially perpendicular to the targets. Then, high-density plasma is generated between the two targets facing each other, and surfaces of the targets are sputtered by the plasma, whereby the oxide semiconductor film 106 is deposited over the substrate. Thus, the substrate over which a film is to be deposited is not (or hardly) exposed to plasma or a secondary electron directly.

Further, in the case where the oxide semiconductor film 106 is deposited by sputtering in a rare gas atmosphere, helium may be used instead of argon. When helium whose mass number is smaller than that of argon is used, the energy of a constituent element of the oxide semiconductor film 106 when colliding with the base insulating film 104 can be reduced. Furthermore, after part of the oxide semiconductor film 106 in the vicinity of the interface with the base insulating film 104 is deposited in a helium atmosphere, the atmosphere in the deposition chamber is switched into an argon atmosphere, whereby the deposition rate of the oxide semiconductor film 106 can be increased.

Alternatively, the oxide semiconductor film 106 may be deposited by a method by which the impact on the base insulating film 104 is small, such as an atomic layer deposition (ALD) method, an evaporation method, or a coating method.

As described above, the oxide semiconductor film 106 is deposited under the condition that the energy of a constituent element of the oxide semiconductor film 106 when colliding with the base insulating film 104 is reduced, so that in the oxide semiconductor film 106, the region 106a where a concentration of silicon distributed from the interface with the base insulating film 104 toward the inside of the oxide semiconductor film 106 is lower than or equal to 1.0 at. %, preferably lower than or equal to 0.1 at. %. Here, the region 106b indicates a region other than the region 106a in the oxide semiconductor film 106.

Further, when the oxide semiconductor film 106 is deposited in such a manner, entry of impurities such as carbon included in the base insulating film 104 into the oxide semiconductor film 106 can be also reduced. Thus, the concentration of carbon included in the region 106a is lower than or equal to $1.0 \times 10^{20}$ atoms/cm$^3$, preferably lower than or equal to $1.0 \times 10^{19}$ atoms/cm$^3$.

In the case where the oxide semiconductor film 106 is a CAAC-OS film, the amount of impurities such as silicon taken into the region 106a is reduced, so that a crystal portion in which c-axis is aligned in a direction parallel to a normal vector of the surface of the base insulating film 104 can be formed from the interface with the base insulating film 104.

After the oxide semiconductor film 106 is formed, heat treatment may be performed on the oxide semiconductor film 106. The temperature of the heat treatment is higher than or equal to 300° C. and lower than or equal to 700° C., or lower than the strain point of the substrate. When the heat treatment is performed, excess hydrogen (including water and a hydroxyl group) can be removed. Note that the heat treatment is also referred to as dehydration treatment (dehydrogenation treatment) in this specification and the like in some cases.

The heat treatment can be performed in such a manner that, for example, an object to be processed is introduced into an electric furnace in which a resistance heater or the like is used and heated at 450° C. in a nitrogen atmosphere for one hour. During the heat treatment, the oxide semiconductor film 106 is not exposed to air to prevent entry of water and hydrogen.

The heat treatment apparatus is not limited to the electric furnace and may be an apparatus for heating an object by thermal radiation or thermal conduction from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the heat treatment, the GRTA process may be performed as follows. The object is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object. Note that the inert gas may be switched to a gas containing oxygen during the process.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

The dehydration treatment (dehydrogenation treatment) might be accompanied by elimination of oxygen which is a main constituent material for an oxide semiconductor film to lead to a reduction in oxygen. An oxygen vacancy exists in a portion where oxygen is eliminated in an oxide semiconductor film, and a donor level which leads to a change in the electric characteristics of a transistor is formed owing to the oxygen vacancy. Therefore, in the case where the dehydration treatment (dehydrogenation treatment) is performed, oxygen is preferably supplied to the oxide semiconductor film 106. By supply of oxygen to the oxide semiconductor film 106, oxygen vacancies in the film can be filled.

The oxygen vacancy in the oxide semiconductor film 106 may be filled in the following manner for example: after the oxide semiconductor film 106 is subjected to the dehydration treatment (dehydrogenation treatment), a high-purity oxygen gas, a dinitrogen monoxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace. It is preferable that water, hydrogen, and the like not be contained in the oxygen gas or the dinitrogen monoxide gas. The purity of the oxygen gas or the dinitrogen monoxide gas which is introduced into the heat treatment apparatus is preferably 6N (99.9999%) or more, further preferably 7N (99.99999%) or more (i.e., the impurity concentration in the oxygen gas or the dinitrogen monoxide gas is preferably less than or equal to 1 ppm, further preferably less than or equal to 0.1 ppm).

As an example of a method for supplying oxygen to the oxide semiconductor film 106, oxygen (including at least any one of oxygen radicals, oxygen atoms, and oxygen ions) may be added to the oxide semiconductor film 106 in order to supply oxygen to the oxide semiconductor film 106. An ion implantation method, an ion doping method, a plasma immersion ion implantation method, plasma treatment, or the like can be used as a method for adding oxygen.

As another example of a method for supplying oxygen to the oxide semiconductor film 106, oxygen may be supplied to the oxide semiconductor film 106 in such a manner that the base insulating film 104, the gate insulating film 108 to be formed later, or the like is heated and part of oxygen is released.

As described above, after formation of the oxide semiconductor film 106, it is preferable that dehydration treatment (dehydrogenation treatment) be performed to remove hydrogen or moisture from the oxide semiconductor film 106, so that the oxide semiconductor film is highly purified so as to include as few impurities as possible, and oxygen whose amount is reduced in the dehydration treatment (dehydrogenation treatment) be added to the oxide semiconductor or excess oxygen be supplied to fill the oxygen vacancies in the oxide semiconductor film 106. In this specification and the like, supplying oxygen to the oxide semiconductor film 106 may be expressed as oxygen adding treatment or oxygen supplying treatment.

Note that the case is described where dehydration treatment (dehydrogenation treatment) and oxygen adding treatment are performed after the oxide semiconductor film 106 is processed to have an island shape; however, an embodiment of the disclosed invention is not construed as being limited to the case. Such treatment may be performed before the oxide semiconductor film 106 is processed to have an island shape. Alternatively, after the insulating film 114 is formed, heat treatment may be performed so that oxygen is supplied from the base insulating film 104, the gate insulating film 108, or the like to the oxide semiconductor film 106.

In this manner, hydrogen or moisture is removed from the oxide semiconductor film 106 by dehydration treatment (dehydrogenation treatment) and oxygen vacancies therein are filled by oxygen adding treatment, whereby the oxide semiconductor film 106 can be turned into an i-type (intrinsic) or substantially i-type oxide semiconductor film. The oxide semiconductor film 106 formed in such a manner includes extremely few (close to zero) carriers derived from a donor, and the carrier concentration thereof is lower than $1 \times 10^{14}/cm^3$, preferably lower than $1 \times 10^{12}/cm^3$, further preferably lower than $1 \times 10^{11}/cm^3$.

Figure 2C:
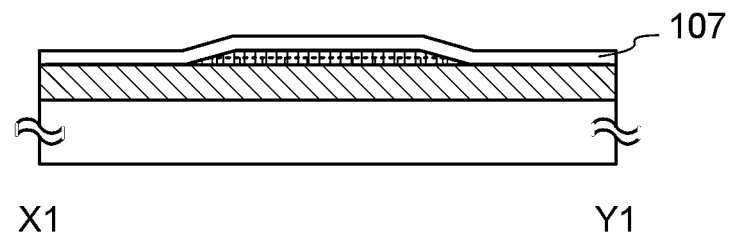

Next, an insulating film 107 is formed over the oxide semiconductor film 106 (see FIG. 2C). The insulating film 107 can have a thickness of greater than or equal to 1 nm and less than or equal to 500 nm, for example. There is no particular limitation on a method for forming the insulating film 107; for example, a sputtering method, an MBE method, a CVD method, a pulse laser deposition method, an ALD method, or the like can be used as appropriate. Note that the insulating film 107 is processed to be the gate insulating film 108 in a later step.

The insulating film 107 can be formed using silicon oxide, gallium oxide, aluminum oxide, silicon nitride, silicon oxynitride, aluminum oxynitride, silicon nitride oxide, or the like. A portion of the insulating film 107, which is in contact with the oxide semiconductor film 106, preferably contains oxygen. In particular, the insulating film 107 preferably contains oxygen at an amount which exceeds at least the stoichiometric composition. For example, in the case where a silicon oxide film is used as the insulating film 107, a film of $SiO_{2+\alpha}$ ($\alpha > 0$) is preferably used. In this embodiment, a silicon oxide film of $SiO_{2+\alpha}$ ($\alpha>0$) is used as the insulating film 107. With the use of the silicon oxide film as the insulating film 107, oxygen can be supplied to the oxide semiconductor film 106 from the insulating film 107 as well as from the base insulating film 104 and favorable electric characteristics can be obtained.

The insulating film 107 can be formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, whereby gate leakage current can be reduced. Further, the insulating film 107 may have a single-layer structure or a stacked-layer structure.

Figure 2D:
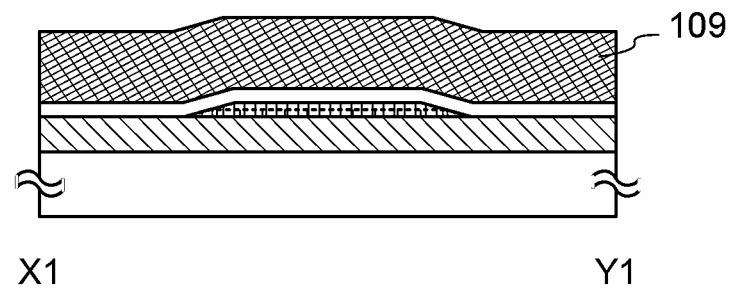

Next, a conductive film 109 to be a gate electrode (including a wiring formed using the same layer as the gate electrode) is formed over the insulating film 107 (see FIG. 2D). The conductive film 109 to be a gate electrode can be formed using a metal material such as molybdenum, titanium, tantalum, tungsten, aluminum, copper, neodymium, or scandium; or an alloy material including any of these materials as its main component, for example. Alternatively, the conductive film 109 to be a gate electrode may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), or any of these metal oxide materials in which silicon or silicon oxide is included can be used. The conductive film 109 to be a gate electrode can be formed to have a single layer or a stacked structure using any of the above materials. There is no particular limitation on the formation method, and a variety of film formation methods such as an evaporation method, a CVD method, a sputtering method, or a spin coating method can be employed.

Next, a resist mask is formed over the conductive film 109 in a photolithography step, and selective etching is performed; thus, the gate electrode 110 is formed. After that, the resist mask is removed. Then, the insulating film 107 is etched with the use of the gate electrode 110 as a mask and a portion of the insulating film 107 which is not located under the gate electrode 110 is removed; thus, the gate insulating film 108 is formed (see FIG. 3A).

The resist mask used for forming the gate electrode 110 may be formed by an inkjet method. Formation of the resist mask by an inkjet method needs no photomask; thus, manufacturing cost can be reduced. The gate electrode 110 and the gate insulating film 108 may be etched by either dry etching or wet etching, or by both of them.

Next, a conductive film used for a source electrode and a drain electrode (including a wiring formed using the same layer as the source electrode and the drain electrode) is formed over the oxide semiconductor film 106. As the conductive film used for the source electrode and the drain electrode, for example, a metal film containing an element selected from aluminum, chromium, copper, tantalum, titanium, molybdenum, and tungsten, a metal nitride film containing any of the above elements as its component (e.g., a titanium nitride film, a molybdenum nitride film, or a tungsten nitride film), or the like can be used. Alternatively, the conductive film may have a structure in which a film of a high-melting-point metal such as titanium, molybdenum, or tungsten, or a nitride film of any of these metals (a titanium nitride film, a molybdenum nitride film, or a tungsten nitride film) is stacked on either or both of the bottom surface and the top surface of a metal film of aluminum, copper, or the like. Further, the conductive film used for the source electrode and the drain electrode may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), or indium zinc oxide ($In_2O_3$—ZnO) can be used. The conductive film used for the source electrode and the drain electrode can be formed using any of the above materials to have a single layer or a stacked structure. There is no particular limitation on the formation method, and a variety of film formation methods such as an evaporation method, a CVD method, a sputtering method, or a spin coating method can be employed.

Then, a resist mask is formed over the conductive film in a photolithography step, and selective etching is performed; thus, the source electrode 112a and the drain electrode 112b are formed. After that, the resist mask is removed. Thus, the transistor 150 is formed (see FIG. 3B).

In order to reduce the number of photomasks and the number of steps for the photolithography step, etching may be performed with the use of a resist mask formed using a multi-tone mask which is a light-exposure mask through which light is transmitted to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds or more of different patterns can be formed by one multi-tone mask. Thus, the number of light-exposure masks can be reduced and the number of corresponding photolithography steps can also be reduced, whereby simplification of a process can be realized.

Figure 3A:
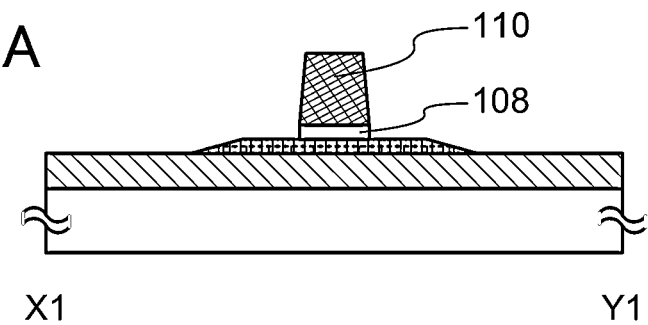
FIGS. 3A to 3C are cross-sectional views illustrating an example of a method for manufacturing a semiconductor device.
Figure 3B:
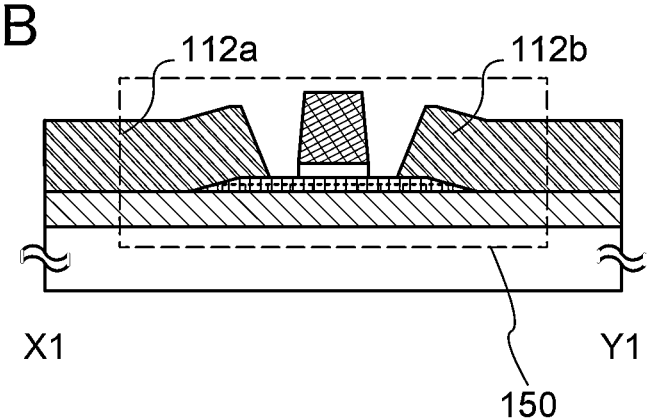
Figure 3C:
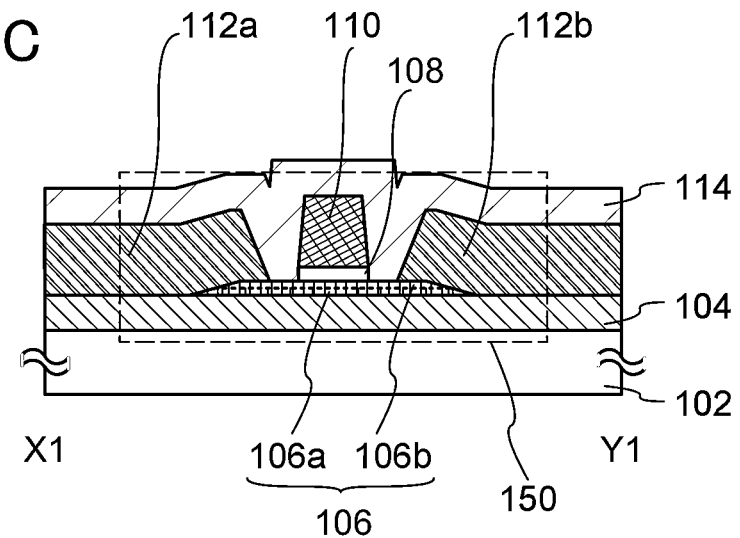

Next, the insulating film 114 is formed over the transistor 150 (see FIG. 3C).

The insulating film 114 is preferably formed using an inorganic insulating film and may be formed as a single layer or a stacked layer of any of oxide insulating films such as a silicon oxide film, a silicon oxynitride film, an aluminum oxide film, an aluminum oxynitride film, a gallium oxide film, and a hafnium oxide film. Further, over the above oxide insulating film, a single layer or a stacked layer of any of nitride insulating films such as a silicon nitride film, a silicon nitride oxide film, an aluminum nitride film, and an aluminum nitride oxide film may be formed. For example, by a sputtering method, a silicon oxide film and an aluminum oxide film are stacked from the gate electrode 110 side.

A planarization insulating film may be formed over the insulating film 114. For the planarization insulating film, a heat-resistant organic material such as an acrylic-based resin, a polyimide-based resin, a benzocyclobutene-based resin, a polyamide-based resin, or an epoxy-based resin can be used. Other than such organic materials, a low-dielectric constant material (a low-k material), a siloxane-based resin, or the like can be used. Note that the planarization insulating film may be formed by stacking a plurality of insulating films formed of any of these materials.

Through the above process, the transistor 150 is formed. In the transistor 150, the concentration of impurities such as silicon taken into the region 106a of the oxide semiconductor film 106 is small. Further, in the case where the oxide semiconductor film is a CAAC-OS film, a crystal portion can be formed even in the vicinity of the interface with the base insulating film 104. Thus, the transistor 150 can have stable electric characteristics.

The structure, method, and the like described in this embodiment can be combined as appropriate with any of the structures, methods, and the like described in the other embodiments.

(Embodiment 2)

In this embodiment, a modification example of the semiconductor device described in Embodiment 1 with reference to FIGS. 1A and 1B, FIGS. 2A to 2D, and FIGS. 3A to 3C and its manufacturing method will be described with reference to FIGS. 4A and 4B, FIGS. 5A to 5D, and FIGS. 6A and 6B. Note that portions similar to those in FIGS. 1A and 1B, FIGS. 2A to 2D, and FIGS. 3A to 3C are denoted by the same reference numerals, and description thereof is skipped.

<Structure Example (Modification Example) of Semiconductor Device>

Figure 4A:
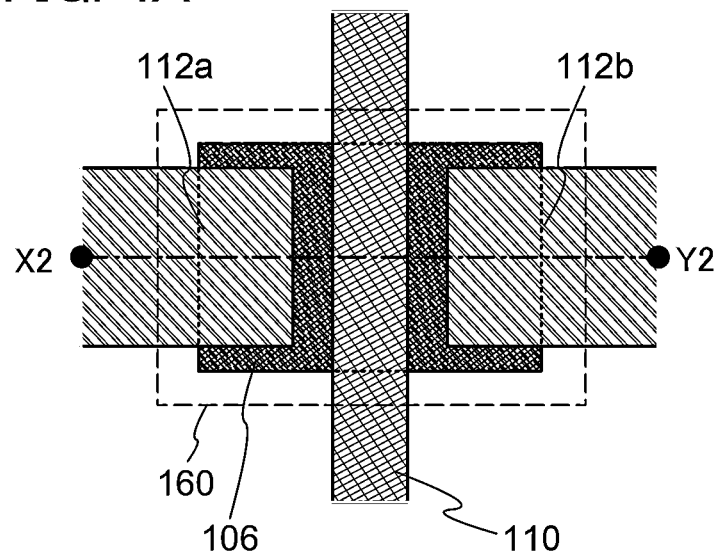
FIGS. 4A and 4B are a plan view and a cross-sectional view illustrating an embodiment of a semiconductor device.
Figure 4B:
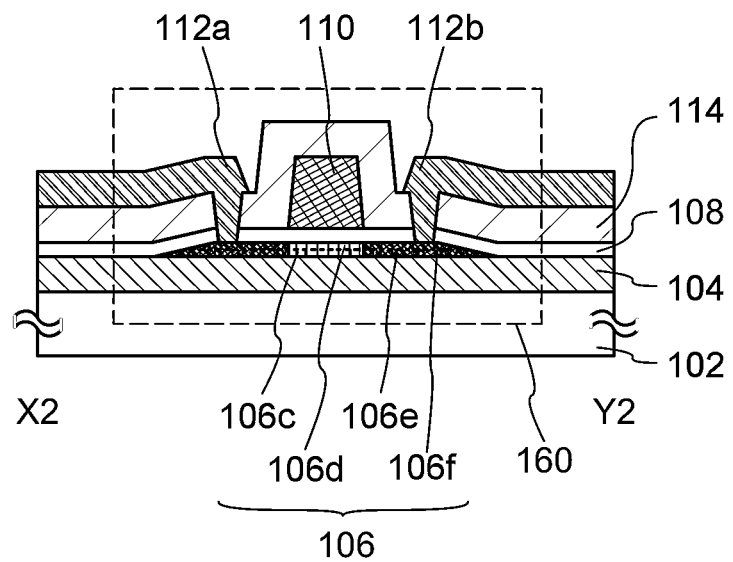

FIGS. 4A and 4B are a plan view and a cross-sectional view of a top-gate transistor as an example of a semiconductor device. FIG. 4A is a plan view and FIG. 4B is a cross-sectional view taken along line X2-Y2 in FIG. 4A. Note that in FIG. 4A, some of components of a transistor 160 (e.g., the gate insulating film 108) are omitted for brevity.

The transistor 160 illustrated in FIGS. 4A and 4B includes, over the substrate 102, the base insulating film 104, an oxide semiconductor film 106 which includes a region 106c, a region 106d, regions 106e, and regions 106f and is formed over the base insulating film 104, the gate insulating film 108 formed over the oxide semiconductor film 106, the gate electrode 110 which is in contact with the gate insulating film 108 and overlaps with at least the oxide semiconductor film 106, the insulating film 114 formed over the gate insulating film 108 and the gate electrode 110, and the source electrode 112a and the drain electrode 112b which are formed over the insulating film 114 and electrically connected to the oxide semiconductor film 106.

The oxide semiconductor film 106 includes the region 106c and the region 106d serving as a channel formation region, and further includes a pair of regions 106e and a pair of regions 106f serving as low-resistance regions.

The thickness of the oxide semiconductor film 106 is greater than 5 nm and less than or equal to 200 nm, preferably greater than or equal to 10 nm and less than or equal to 30 nm. The oxide semiconductor film 106 preferably has a structure with crystallinity, such as a single crystal structure, a microcrystalline structure, or the like.

In this embodiment, the oxide semiconductor film 106 is a CAAC-OS film.

As illustrated in FIG. 4B, an end portion of the oxide semiconductor film 106 is preferably tapered at an angle of 20° to 50°. When the oxide semiconductor film 106 has a perpendicular end portion, oxygen is easily released from the end portion of the oxide semiconductor film 106 and thus oxygen vacancies are likely to be generated. When the oxide semiconductor film 106 has a tapered end portion, generation of oxygen vacancies is suppressed, and thus generation of leakage current of the transistor 160 can be reduced.

The base insulating film 104 preferably has a function of preventing diffusion of an impurity element such as hydrogen or moisture from the substrate 102 and a function of supplying oxygen to the oxide semiconductor film 106. For example, an insulating film including silicon, such as a silicon oxide film, is preferably used as the base insulating film 104. Further, the base insulating film 104 may have a single-layer structure including silicon or a stacked structure including two or more of layers of an insulating film including a constituent element other than silicon and an insulating film including silicon. Note that it is preferable that a silicon oxide film serving as the base insulating film 104 be provided in contact with the oxide semiconductor film 106. This is because the silicon oxide film can favorably supply oxygen to the oxide semiconductor film 106.

"Supplying oxygen from the base insulating film 104 to the oxide semiconductor film 106" means that, for example, part of oxygen is released by heating the base insulating film 104 and the released oxygen is supplied to the oxide semiconductor film 106 to fill oxygen vacancies in the oxide semiconductor film 106. In particular, the base insulating film 104 preferably contains oxygen at an amount which exceeds at least that in the stoichiometric composition. For example, a silicon oxide film of $SiO_{2+\alpha}$ ($\alpha>0$) is preferably used as the base insulating film 104. When such a silicon oxide film is used as the base insulating film 104, oxygen can be supplied to the oxide semiconductor film 106, so that the transistor 160 including the oxide semiconductor film 106 can have favorable transistor characteristics.

However, in the case of using a silicon oxide film as the base insulating film 104, silicon in the base insulating film 104 might be taken into the oxide semiconductor film 106 as an impurity. When silicon or the like is taken into the oxide semiconductor film 106 as an impurity, the resistance of the oxide semiconductor film 106 is increased, which leads to a decrease in on-state current or field-effect mobility, which is one of electric characteristics of a transistor.

Further, when an impurity element is taken into the oxide semiconductor film 106 in the vicinity of the surface on which the oxide semiconductor film 106 is formed (formed film surface), crystallization of the oxide semiconductor film 106 is inhibited by the impurity element. Thus, an amorphous region is left in the oxide semiconductor film 106 in the vicinity of the formed film surface. In addition, in the case where the oxide semiconductor film 106 is a CAAC-OS film, it is difficult to form a crystal portion in the vicinity of the formed film surface.

Thus, when an impurity such as silicon or carbon is taken into an oxide semiconductor film, crystallization of the oxide semiconductor film is inhibited. Therefore, in the semiconductor device described in this embodiment, a region which has low concentration of an impurity such as silicon or carbon is provided.

Specifically, the oxide semiconductor film 106 in FIG. 4B includes the region 106c and the regions 106e which are in contact with the interface with the base insulating film 104 and each have a thickness of 5 nm or less and the region 106d and the regions 106f which are regions other than the region 106c and the regions 106e.

As described above, the concentration of impurities such as silicon or carbon taken into the regions 106c and 106e in the oxide semiconductor film 106 is reduced, whereby change in electric characteristics of the transistor 160 can be suppressed. Further, in the case where the oxide semiconductor film 106 is a CAAC-OS film, a crystal portion can be formed even in the vicinity of the interface with the base insulating film 104. When the transistor 160 using the oxide semiconductor film 106 is manufactured, a semiconductor device with stable electric characteristics can be obtained.

Note that the details of the other components of the transistor are described in description of a method for manufacturing the transistor 160 below, with reference to FIGS. 5A to 5D and FIGS. 6A and 6B.

<Method for Manufacturing Transistor 160>

An example of a method for manufacturing the transistor 160 illustrated in FIGS. 4A and 4B, which is an embodiment of the present invention, will be described with reference to FIGS. 5A to 5D and FIGS. 6A and 6B.

First, the substrate 102 is prepared. The substrate 102 can have a structure similar to the structure described in Embodiment 1.

Figure 5A:
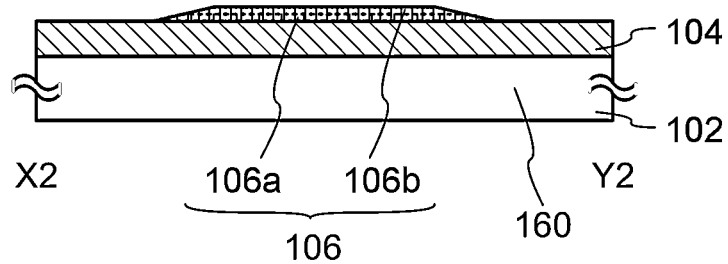
FIGS. 5A to 5D are cross-sectional views illustrating an example of a method for manufacturing a semiconductor device.

Next, the base insulating film 104 is formed over the substrate 102 (see FIG. 5A). The base insulating film 104 has a function of preventing diffusion of an impurity element such as hydrogen or moisture from the substrate 102, and can be formed with a single-layer structure or a stacked-layer structure using one or more of a silicon nitride film, a silicon oxide film, a silicon nitride oxide film, and a silicon oxynitride film.

In addition, the base insulating film 104 has an effect of supplying oxygen to the oxide semiconductor film 106 to be formed later. For example, in the case where an insulating film including silicon, particularly a silicon oxide film is used as the base insulating film 104, part of oxygen can be released by heating the base insulating film 104; thus, oxygen can be supplied to the oxide semiconductor film 106 to fill oxygen vacancies in the oxide semiconductor film 106. In particular, the base insulating film 104 preferably contains oxygen at an amount which exceeds at least that in the stoichiometric composition. For example, a silicon oxide film of $SiO_{2+\alpha}$ ($\alpha>0$) is preferably used as the base insulating film 104. When such a silicon oxide film is used as the base insulating film 104, oxygen can be supplied to the oxide semiconductor film 106, so that the transistor 160 including the oxide semiconductor film 106 can have favorable transistor characteristics.

The substrate 102 may be subjected to plasma treatment or the like before the base insulating film 104 is formed. As plasma treatment, for example, reverse sputtering in which an argon gas is introduced and plasma is generated can be performed. The reverse sputtering is a method in which voltage is applied to the substrate 102 side with the use of an RF power source in an argon atmosphere and plasma is generated in the vicinity of the substrate 102 so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the substrate 102.

Next, an oxide semiconductor film is formed over the base insulating film 104 and a photolithography step and an etching step are performed. Thus, the oxide semiconductor film 106 is formed (see FIG. 5A). The oxide semiconductor film 106 is preferably a CAAC-OS film. Note that the base insulating film 104 and the oxide semiconductor film 106 are preferably formed successively without exposure to the air.

Note that in the case where the oxide semiconductor film 106 is formed by a sputtering method, when an element for forming the oxide semiconductor film 106 collides with the base insulating film 104, an element that is a constituent element of the base insulating film 104 enters the oxide semiconductor film 106 (mixing or a mixing effect). In the oxide semiconductor film 106 in FIG. 5A, a region formed due to mixing is the region 106a and a region other than the region 106a is the region 106b.

Such mixing significantly occurs in the oxide semiconductor film 106 in the vicinity of the interface with the base insulating film 104, specifically occurs in the region 106a. When a constituent element of the base insulating film 104 enters the oxide semiconductor film 106, the resistance of the oxide semiconductor film 106 is increased, which might cause a decrease in on-state current or field-effect mobility, which is one of electric characteristics of a transistor. Further, in the case where the oxide semiconductor film 106 is a CAAC-OS film, the oxide semiconductor film 106 in the vicinity of the base insulating film 104 is prevented from being crystallized.

The oxide semiconductor film 106 can be formed using a material and a method similar to those described in Embodiment 1.

The oxide semiconductor film 106 is deposited under the condition that the energy of a constituent element of the oxide semiconductor film 106 when colliding with the base insulating film 104 is reduced, so that in the oxide semiconductor film 106, the region 106a where a concentration of silicon distributed from the interface with the base insulating film 104 toward the inside of the oxide semiconductor film 106 is lower than or equal to 1.0 at. %, preferably lower than or equal to 0.1 at. %. Here, the region 106b indicates a region other than the region 106a in the oxide semiconductor film 106.

Note that in this embodiment, in a later step, the region 106c and the regions 106e are formed in the region 106a and the region 106d and the regions 106f are formed in the region 106b.

Further, when the oxide semiconductor film 106 is deposited in such a manner, entry of impurities such as carbon included in the base insulating film 104 into the oxide semiconductor film 106 can also be reduced. Thus, the concentration of carbon included in the region 106a is lower than or equal to $1.0 \times 10^{20}$ atoms/cm$^3$, preferably lower than or equal to $1.0 \times 10^{19}$ atoms/cm$^3$.

In the case where the oxide semiconductor film 106 is a CAAC-OS film, the amount of impurities such as silicon taken into the region 106a is reduced, so that a crystal portion in which c-axis is aligned in a direction parallel to a normal vector of the surface of the base insulating film 104 can be formed from the interface with the base insulating film 104.

Further, the oxide semiconductor film 106 may be subjected to dehydration treatment (dehydrogenation treatment) or oxygen adding treatment after the oxide semiconductor film 106 is formed. The dehydration treatment (dehydrogenation treatment) and the oxygen adding treatment can be each performed in a manner similar to that described in Embodiment 1.

Figure 5B:
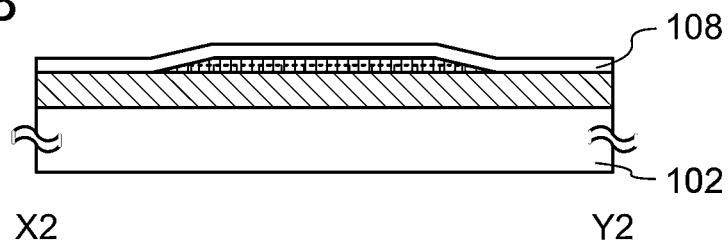
Figure 5C:
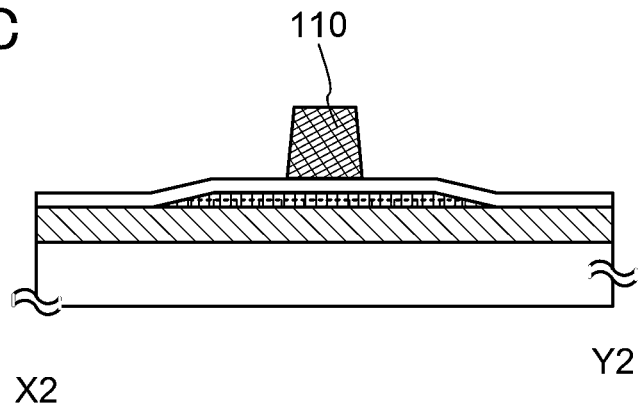

Next, the gate insulating film 108 is formed over the oxide semiconductor film 106 (see FIG. 5B). The gate insulating film 108 can have a thickness of greater than or equal to 1 nm and less than or equal to 500 nm, for example. There is no particular limitation on a method for forming the gate insulating film 108; for example, a sputtering method, an MBE method, a CVD method, a pulse laser deposition method, an ALD method, or the like can be used as appropriate.

The gate insulating film 108 can be formed using silicon oxide, gallium oxide, aluminum oxide, silicon nitride, silicon oxynitride, aluminum oxynitride, silicon nitride oxide, or the like. A portion of the gate insulating film 108, which is in contact with the oxide semiconductor film 106, preferably contains oxygen. In particular, the gate insulating film 108 preferably contains oxygen at an amount which exceeds at least the stoichiometric composition. For example, in the case where a silicon oxide film is used as the gate insulating film 108, a film of $SiO_{2+\alpha}$ ($\alpha>0$) is preferably used. In this embodiment, a silicon oxide film of $SiO_{2+\alpha}$ ($\alpha>0$) is used as the gate insulating film 108. With the use of the silicon oxide film as the gate insulating film 108, oxygen can be supplied to the oxide semiconductor film 106 from the gate insulating film 108 as well as from the base insulating film 104 and favorable electric characteristics can be obtained.

The gate insulating film 108 can be formed using a high-k material such as hafnium oxide, yttrium oxide, hafnium silicate ($HfSi_xO_y$, ($x>0$, $y>0$)), hafnium silicate to which nitrogen is added ($HfSiO_xN_y$, ($x>0$, $y>0$)), hafnium aluminate ($HfAl_xO_y$, ($x>0$, $y>0$)), or lanthanum oxide, whereby gate leakage current can be reduced. Further, the gate insulating film 108 may have a single-layer structure or a stacked-layer structure.

Next, a conductive film to be a gate electrode (including a wiring formed using the same layer as the gate electrode) is formed over the gate insulating film 108. The conductive film to be a gate electrode can be formed using a metal material such as molybdenum, titanium, tantalum, tungsten, aluminum, copper, neodymium, or scandium; or an alloy material including any of these materials as its main component, for example. Alternatively, the conductive film to be a gate electrode may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), or any of these metal oxide materials in which silicon or silicon oxide is included can be used. The conductive film to be a gate electrode can be formed to have a single layer or a stacked structure using any of the above materials. There is no particular limitation on the formation method, and a variety of film formation methods such as an evaporation method, a CVD method, a sputtering method, or a spin coating method can be employed.

Next, a resist mask is formed over the conductive film in a photolithography step, and selective etching is performed; thus, the gate electrode 110 is formed. After that, the resist mask is removed (see FIG. 5C).

Figure 5D:
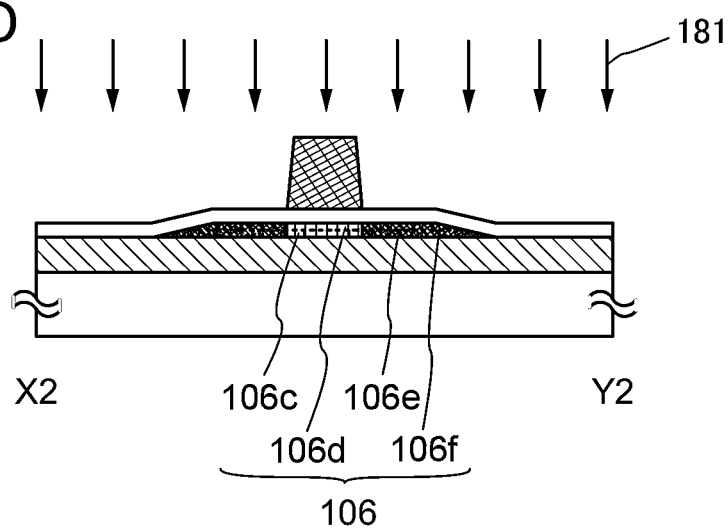

Next, a dopant 181 is introduced to the oxide semiconductor film 106 using the gate electrode 110 as a mask, whereby the pair of regions 106e and the pair of regions 106f serving as low-resistance regions are formed (see FIG. 5D). At this stage, the region 106a becomes the regions 106c and 106e and the region 106b becomes the regions 106d and 106f.

The dopant 181 is an impurity by which the electrical conductivity of the oxide semiconductor film 106 is changed. One or more selected from the following can be used as the dopant 181: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

Alternatively, the dopant 181 can be introduced to the oxide semiconductor film 106 through another film (e.g., the gate insulating film 108) by an implantation method. As a method for introducing the dopant 181, an ion implantation method, an ion doping method, a plasma immersion ion implantation method, or the like can be used. In that case, it is preferable to use a single ion of the dopant 181, or a fluoride ion or a chloride ion thereof.

The introduction of the dopant 181 may be controlled by setting the addition conditions such as the accelerated voltage and the dosage, or the thickness of the film through which the dopant passes as appropriate. In this embodiment, phosphorus is used as the dopant 181, whose ion is added by an ion implantation method. The dosage of ions of the dopant 181 is preferably set to be greater than or equal to $1 \times 10^{13}$ ions/$cm^2$ and less than or equal to $5 \times 10^{16}$ ions/$cm^2$.

The concentration of the dopant 181 in the low-resistance regions is preferably higher than or equal to $5 \times 10^{18}$/$cm^3$ and lower than or equal to $1 \times 10^{22}$/$cm^3$.

The dopant 181 may be introduced with the substrate 102 heated.

The introduction of the dopant 181 into the oxide semiconductor film 106 may be performed plural times, and the number of kinds of dopant may be plural.

Further, heat treatment may be performed thereon after the introduction of the dopant 181. The heat treatment is preferably performed at a temperature higher than or equal to 300° C. and lower than or equal to 700° C., more preferably higher than or equal to 300° C. and lower than or equal to 450° C., for one hour under an oxygen atmosphere. The heat treatment may be performed under a nitrogen atmosphere, reduced pressure, or the air (ultra-dry air).

In the case where the oxide semiconductor film 106 is a crystalline oxide semiconductor film or a CAAC-OS film, part of the oxide semiconductor film 106 becomes amorphous due to the introduction of the dopant 181 in some cases. In that case, the crystallinity of the oxide semiconductor film 106 can be recovered by performing heat treatment thereon after the introduction of the dopant 181.

Thus, the regions 106c and 106d serving as a channel formation region and the regions 106e and the regions 106f between which the regions 106c and 106d are sandwiched and which serve as low-resistance regions are formed in the oxide semiconductor film 106.

Figure 6A:
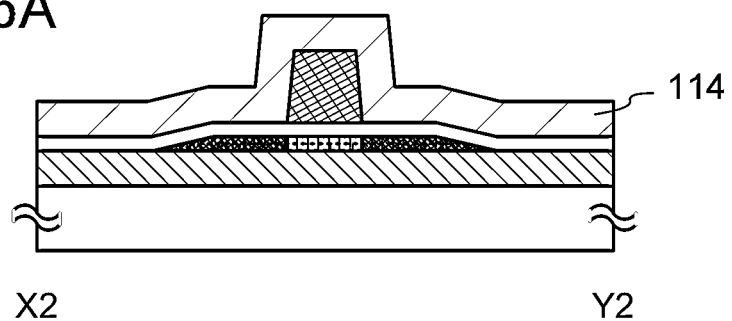
FIGS. 6A and 6B are cross-sectional views illustrating an example of a method for manufacturing a semiconductor device.
Figure 6B:
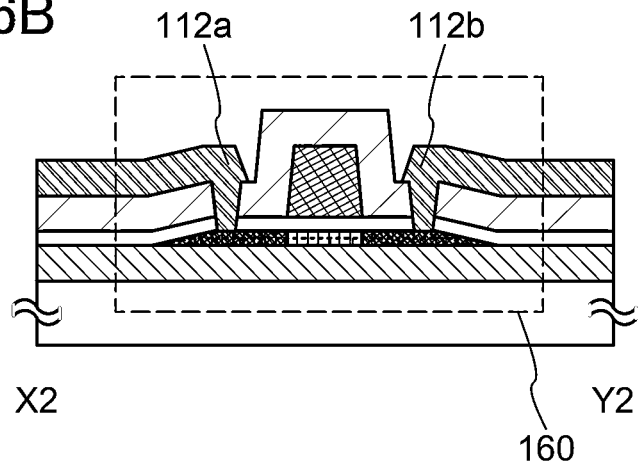

Next, the insulating film 114 is formed over the gate insulating film 108 and the gate electrode 110 (see FIG. 6A).

The insulating film 114 can have a structure similar to the structure described in Embodiment 1.

It is preferable that the oxide semiconductor film 106 be subjected to heat treatment after the insulating film 114 is formed. The heat treatment can be performed in a manner similar to that described in Embodiment 1.

Next, opening portions reaching the oxide semiconductor film 106 (the regions 106e or the regions 1060 are formed in the gate insulating film 108 and the insulating film 114, and a conductive film used for a source electrode and a drain electrode (including a wiring formed using the same layer as the source electrode and the drain electrode) is formed in the opening portions. The conductive film used for the source electrode and the drain electrode can be formed using a material similar to that described in Embodiment 1.

Next, a resist mask is formed over the conductive film in a photolithography step and selective etching is performed, so that the source electrode 112a and the drain electrode 112b are formed. Then, the resist mask is removed. Thus, the transistor 160 is formed (see FIG. 6B).

Further, a planarization insulating film may be formed over the transistor 160. For the planarization insulating film, a heat-resistant organic material such as an acrylic-based resin, a polyimide-based resin, a benzocyclobutene-based resin, a polyamide-based resin, or an epoxy-based resin can be used. Other than such organic materials, a low-dielectric constant material (a low-k material), a siloxane-based resin, or the like can be used. Note that the planarization insulating film may be formed by stacking a plurality of insulating films formed of any of these materials.

In the transistor 160, the concentration of impurities such as silicon taken into the regions 106c and 106e of the oxide semiconductor film 106 is small. Further, in the case where the oxide semiconductor film is a CAAC-OS film, a crystal portion can be formed even in the vicinity of the interface with the base insulating film 104. Thus, the transistor 160 can have stable electric characteristics.

The structure, method, and the like described in this embodiment can be combined as appropriate with any of the structures, methods, and the like described in the other embodiments.

(Embodiment 3)

In this embodiment, an example of a semiconductor device which includes the transistor described in this specification, can hold stored data even when not powered, and does not have a limitation on the number of write cycles will be described with reference to drawings.

Figure 7A:
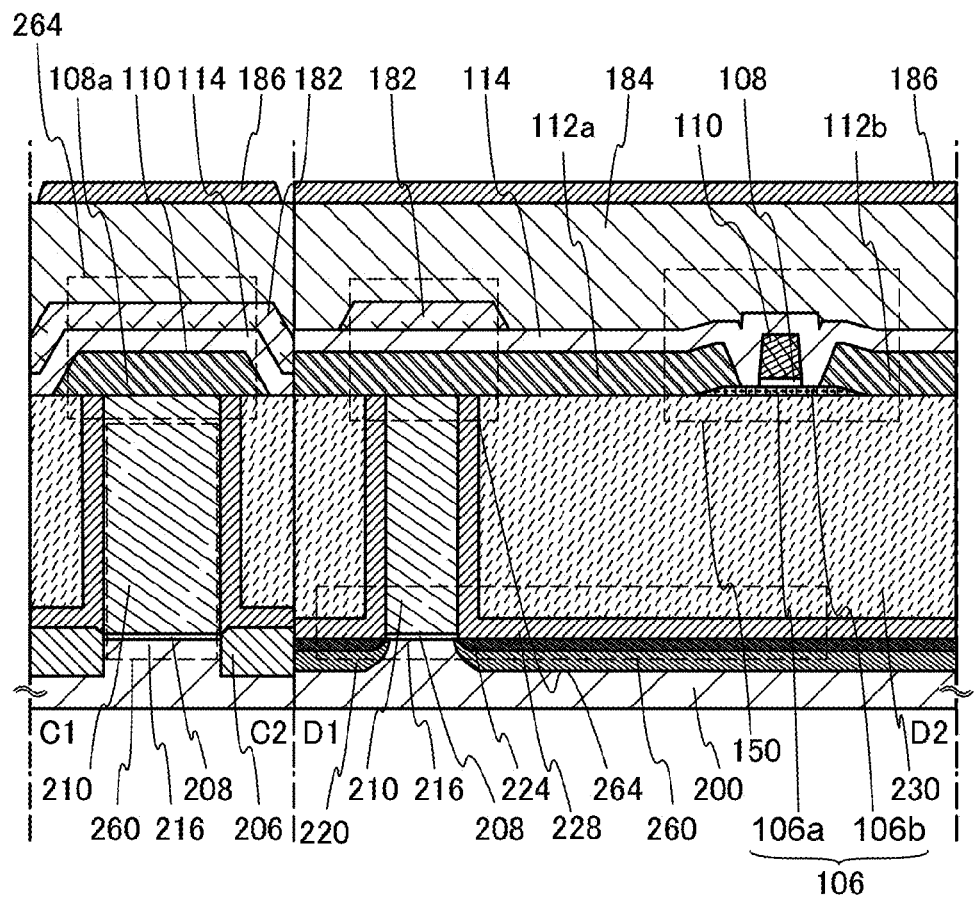
FIGS. 7A to 7C illustrate an embodiment of a semiconductor device.
Figure 7B:
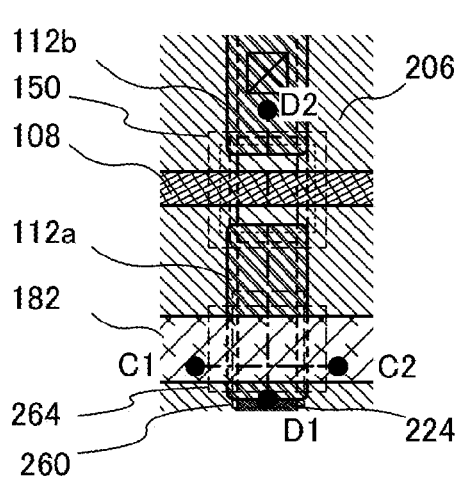
Figure 7C:
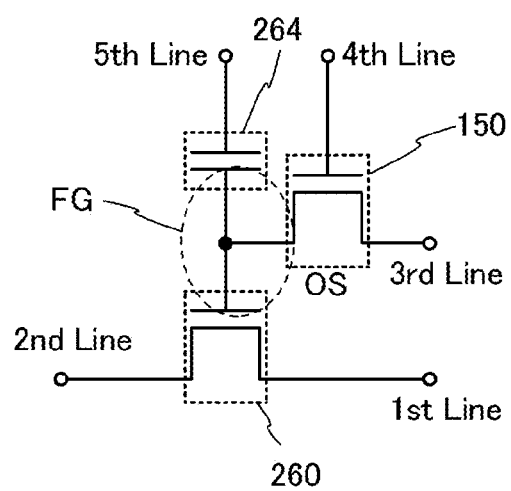

FIGS. 7A to 7C illustrate an example of a structure of a semiconductor device. FIGS. 7A to 7C illustrate a cross-sectional view, a plan view, and a circuit diagram, respectively, of the semiconductor device. Here, FIG. 7A corresponds to cross sections taken along lines C1-C2 and D1-D2 of FIG. 7B.

The semiconductor device illustrated in FIGS. 7A and 7B includes a transistor 260 including a first semiconductor material in a lower portion, and the transistor 150 including a second semiconductor material in an upper portion. The structure of the transistor described in Embodiment 1 can be applied to the transistor 150. The transistor 150 is an example in which the source electrode 112a and the drain electrode 112b are provided in contact with the oxide semiconductor film 106. Although not described in this embodiment, the transistor described in Embodiment 2 can also be employed.

Here, the first semiconductor material and the second semiconductor material are preferably materials having different band gaps. For example, the first semiconductor material can be a semiconductor material (such as single crystal silicon) other than an oxide semiconductor, and the second semiconductor material can be an oxide semiconductor. A transistor including a material other than an oxide semiconductor, such as single crystal silicon, can operate at high speed easily. On the other hand, a transistor including an oxide semiconductor enables holding of charge for a long time owing to its characteristics.

Although all the transistors are n-channel transistors here, it is needless to say that p-channel transistors can be used. The specific constituent of the semiconductor device is not necessarily limited to those described here such as the material used for the semiconductor device and the structure of the semiconductor device as long as the transistor 150 described in Embodiment 1, which is formed using an oxide semiconductor, is used for holding data.

The transistor 260 in FIG. 7A includes a channel formation region 216 provided in a substrate 200 including a semiconductor material (e.g., silicon), impurity regions 220 provided such that the channel formation region 216 is sandwiched therebetween, intermetallic compound regions 224 in contact with the impurity regions 220, a gate insulating film 208 provided over the channel formation region 216, and a gate electrode 210 provided over the gate insulating film 208. Note that a transistor whose source electrode and drain electrode are not illustrated in a drawing may be referred to as a transistor for the sake of convenience. Further, in such a case, in description of a connection of a transistor, a source region and a source electrode may be collectively referred to as a "source electrode", and a drain region and a drain electrode may be collectively referred to as a "drain electrode". That is, in this specification, the term "source electrode" may include a source region.

An element isolation insulating film 206 is provided over the substrate 200 to surround the transistor 260. An insulating film 228 and an insulating film 230 are provided to cover the transistor 260. Note that in order to achieve high integration, the transistor 260 preferably has a structure without a sidewall insulating film as illustrated in FIG. 7A. On the other hand, when the characteristics of the transistor 260 have priority, a sidewall insulating film may be formed on a side surface of the gate electrode 210 and the impurity regions 220 may each include a region having a different impurity concentration.

The transistor 260 formed using a single crystal semiconductor substrate can operate at high speed. Thus, when the transistor is used as a reading transistor, data can be read at high speed. Two insulating films are formed so as to cover the transistor 260. As treatment prior to formation of the transistor 150 and a capacitor 264, CMP treatment is performed on the two insulating films so that the insulating film 228 and the insulating film 230 are formed to be planarized and an upper surface of the gate electrode 210 is exposed.

As the insulating film 228, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used typically. As the insulating film 230, an inorganic insulating film containing silicon, such as a silicon oxide film, a silicon oxynitride film, or a silicon nitride oxide film can be used. The insulating film 228 and the insulating film 230 can be formed by a plasma CVD method, a sputtering method, or the like.

Alternatively, an organic material such as a polyimide-based resin, an acrylic-based resin, or a benzocyclobutene-based resin can be used for the insulating film 228. Other than such organic materials, it is also possible to use a low-dielectric constant material (a low-k material) or the like. In the case of using an organic material, the insulating film 228 may be formed by a wet method such as a spin coating method or a printing method.

Note that in this embodiment, a silicon nitride film is used as the insulating film 228, and a silicon oxide film is used as the insulating film 230.

The oxide semiconductor film 106 is formed over the insulating film 230 which is sufficiently planarized by polishing treatment (e.g., CMP treatment). The average surface roughness of the insulating film 230 is preferably less than or equal to 0.15 nm.

The transistor 150 illustrated in FIG. 7A includes an oxide semiconductor in the channel formation region. Here, the oxide semiconductor film 106 included in the transistor 150 is preferably highly purified. By using a highly purified oxide semiconductor, the transistor 150 which has extremely favorable off-state current characteristics can be obtained.

Since the off-state current of the transistor 150 is small, stored data can be held for a long time owing to such a transistor. In other words, power consumption can be sufficiently reduced because a semiconductor device in which refresh operation is unnecessary or the frequency of refresh operation is extremely low can be provided.

An insulating film 184 having a single-layer structure or a stacked-layer structure is provided over the transistor 150. In this embodiment, a stack in which a silicon oxide film and an aluminum oxide film are stacked from the gate electrode 110 side is used as the insulating film 184. Note that when the aluminum oxide film has high density (e.g., a film density higher than or equal to 3.2 $g/cm^3$, preferably higher than or equal to 3.6 $g/cm^3$), the transistor 150 can have stable electric characteristics.

In addition, a conductive film 182 is provided in a region overlapping with the source electrode 112a of the transistor 150 with the insulating film 114 provided therebetween, and the source electrode 112a, the insulating film 114, and the conductive film 182 form the capacitor 264. That is, the source electrode 112a of the transistor 150 functions as one electrode of the capacitor 264, and the conductive film 182 functions as the other electrode of the capacitor 264. Note that the capacitor 264 may be omitted if a capacitor is not needed. Alternatively, the capacitor 264 may be separately provided above the transistor 150. The insulating film 114 can have a structure similar to that described in Embodiment 1.

The insulating film 184 is provided over the transistor 150 and the capacitor 264. Further, a wiring 186 for connecting the transistor 150 to another transistor is provided over the insulating film 184. Although not illustrated in FIG. 7A, the wiring 186 is electrically connected to the drain electrode 112b through an electrode formed in an opening provided in the insulating film 184, the insulating film 114, and the like. Here, the electrode is preferably provided so as to partly overlap with at least the oxide semiconductor film 106 of the transistor 150.

In FIGS. 7A and 7B, the transistor 260 and the transistor 150 are provided so as to at least partly overlap with each other. The source region or the drain region of the transistor 260 is preferably provided so as to overlap with part of the oxide semiconductor film 106. Further, the transistor 150 and the capacitor 264 are provided so as to overlap with at least part of the transistor 260. For example, the conductive film 182 of the capacitor 264 is provided so as to overlap with at least part of the gate electrode 210 of the transistor 260. With such a planar layout, the area occupied by the semiconductor device can be reduced; thus, higher integration can be achieved.

Note that the electrical connection between the drain electrode 112b and the wiring 186 may be established by direct contact of the drain electrode 112b and the wiring 186 with each other or through an electrode provided in an insulating film lying therebetween. Alternatively, the electrical connection may be established through a plurality of electrodes.

Next, an example of a circuit configuration corresponding to FIGS. 7A and 7B is illustrated in FIG. 7C.

In FIG. 7C, a first wiring (1st Line) is electrically connected to one of a source electrode and a drain electrode of the transistor 260, and a second wiring (2nd Line) is electrically connected to the other of the source electrode and the drain electrode of the transistor 260. A third wiring (3rd Line) is electrically connected to one of a source electrode and a drain electrode of the transistor 150, and a fourth wiring (4th Line) is electrically connected to a gate electrode of the transistor 150. A gate electrode of the transistor 260 and the other of the source electrode and the drain electrode of the transistor 150 are electrically connected to one electrode of the capacitor 264. A fifth wiring (5th Line) is electrically connected to the other electrode of the capacitor 264.

The semiconductor device in FIG. 7C utilizes a characteristic in which the potential of the gate electrode of the transistor 260 can be held, and can thus write, hold, and read data as follows.

Writing and holding of data is described. First, the potential of the fourth wiring is set to a potential at which the transistor 150 is turned on, so that the transistor 150 is turned on. Accordingly, the potential of the third wiring is supplied to the gate electrode of the transistor 260 and the capacitor 264. That is, predetermined charge is given to the gate electrode of the transistor 260 (writing). Here, one of two kinds of charges providing different potentials (hereinafter referred to as a low-level charge and a high-level charge) is applied. After that, the potential of the fourth wiring is set to a potential at which the transistor 150 is turned off, so that the transistor 150 is turned off. Thus, the charge given to the gate electrode of the transistor 260 is held (holding).

Since the off-state current of the transistor 150 is extremely small, the charge of the gate electrode of the transistor 260 is held for a long time.

Next, reading of data is described. By supplying an appropriate potential (reading potential) to the fifth wiring while a predetermined potential (constant potential) is supplied to the first wiring, the potential of the second wiring varies depending on the amount of charge held in the gate electrode of the transistor 260. This is because in general, when the transistor 260 is an n-channel transistor, an apparent threshold voltage $V_{th\_H}$ in the case where a high-level charge is given to the gate electrode of the transistor 260 is lower than an apparent threshold voltage $V_{th\_L}$ in the case where a low-level charge is given to the gate electrode of the transistor 260. Here, an apparent threshold voltage refers to the potential of the fifth wiring, which is needed to turn on the transistor 260. Thus, the potential of the fifth wiring is set to a potential $V_0$ that is between $V_{th\_H}$ and $V_{th\_L}$, whereby charge given to the gate electrode of the transistor 260 can be determined. For example, in the case where a high-level charge is given in writing, when the potential of the fifth wiring is set to $V_0 (>V_{th\_H})$, the transistor 260 is turned on. In the case where a low level charge is given in writing, even when the potential of the fifth wiring is set to $V_0 (<V_{th\_L})$, the transistor 260 remains in an off state. Therefore, the data held can be read by the potential of the second wiring.

Note that in the case where memory cells are arrayed, only data of a desired memory cell needs to be read. In the case where data is not read out, a potential at which the transistor 260 is turned off regardless of the state of the gate electrode, that is, a potential lower than $V_{th\_H}$ may be applied to the fifth wiring. Alternatively, a potential which allows the transistor 260 to be turned on regardless of the state of the gate electrode, that is, a potential higher than $V_{th\_L}$ may be applied to the fifth wiring.

When a transistor having a channel formation region formed using an oxide semiconductor and having extremely small off-state current is applied to the semiconductor device in this embodiment, the semiconductor device can hold stored data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to an embodiment of the present invention does not have a limit on the number of times of writing which is a problem in a conventional non-volatile memory, and reliability thereof is drastically improved. Furthermore, data is written depending on the on state and the off state of the transistor, whereby high-speed operation can be easily realized.

In the transistor 150, the concentration of impurities such as silicon taken into the region 106a of the oxide semiconductor film 106 is small. Further, in the case where the oxide semiconductor film 106 is a CAAC-OS film, a crystal portion can be formed even in the vicinity of the interface with the insulating film 230. Thus, the transistor 150 can have stable electric characteristics.

Accordingly, a semiconductor device in which miniaturization and high integration are achieved and which has high electric characteristics can be provided.

The structure, method, and the like described in this embodiment can be combined as appropriate with any of the structures, methods, and the like described in the other embodiments.

(Embodiment 4)

In this embodiment, a semiconductor device which includes the transistor described in Embodiment 1 or 2, can hold stored data even when not powered, and does not have a limitation on the number of write cycles, and which has a structure different from the structure described in Embodiment 3 is described with reference to FIGS. 8A and 8B and FIGS. 9A and 9B.

Figure 8A:
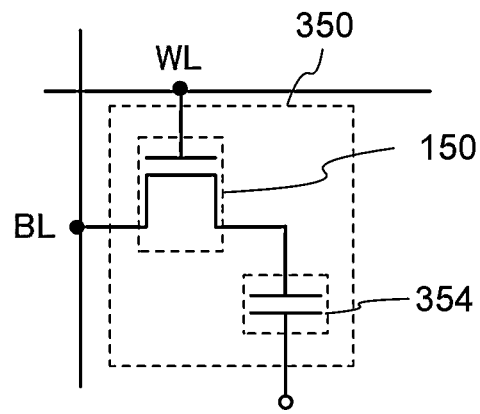
FIGS. 8A and 8B illustrate an embodiment of a semiconductor device.
Figure 8B:
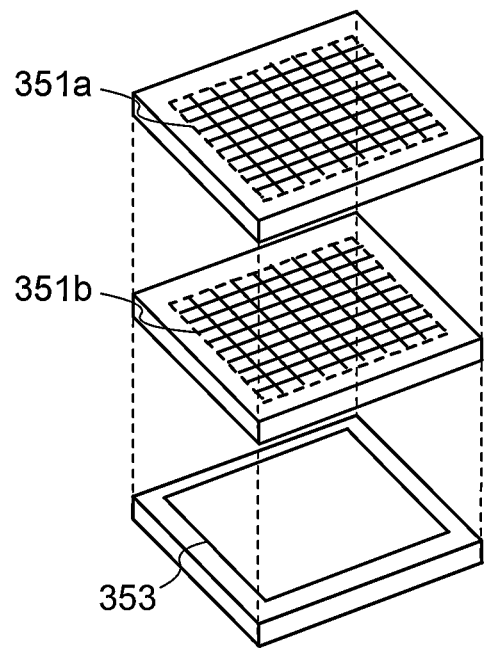

FIG. 8A illustrates an example of a circuit configuration of a semiconductor device, and FIG. 8B is a conceptual diagram illustrating an example of a semiconductor device. First, the semiconductor device illustrated in FIG. 8A is described, and then, the semiconductor device illustrated in FIG. 8B is described.

In the semiconductor device illustrated in FIG. 8A, a bit line BL is electrically connected to the source electrode or the drain electrode of the transistor 150, a word line WL is electrically connected to the gate electrode of the transistor 150, and the source electrode or the drain electrode of the transistor 150 is electrically connected to a first terminal of a capacitor 354.

Off-state current of the transistor 150 formed using an oxide semiconductor is extremely small. For that reason, the potential of the first terminal of the capacitor 354 (or a charge accumulated in the capacitor 354) can be held for an extremely long period by turning off the transistor 150.

Next, writing and holding of data in the semiconductor device (a memory cell 350) illustrated in FIG. 8A will be described.

First, the potential of the word line WL is set to a potential at which the transistor 150 is turned on, so that the transistor 150 is turned on. Accordingly, the potential of the bit line BL is supplied to the first terminal of the capacitor 354 (writing). After that, the potential of the word line WL is set to a potential at which the transistor 150 is turned off, so that the transistor 150 is turned off. Thus, the potential of the first terminal of the capacitor 354 is held (holding).

Since the off-state current of the transistor 150 is extremely small, the potential of the first terminal of the capacitor 354 (or the charge accumulated in the capacitor) can be held for a long time.

Next, reading of data is described. When the transistor 150 is turned on, the bit line BL which is in a floating state and the capacitor 354 are electrically connected to each other, and the charge is redistributed between the bit line BL and the capacitor 354. As a result, the potential of the bit line BL is changed. The amount of change in potential of the bit line BL varies depending on the potential of the first terminal of the capacitor 354 (or the charge accumulated in the capacitor 354).

For example, the potential of the bit line BL obtained after charge redistribution is $(CB \times VB0 + C \times V)/(CB+C)$, where V is the potential of the first terminal of the capacitor 354, C is the capacitance of the capacitor 354, CB is the capacitance of the bit line BL (hereinafter also referred to as bit line capacitance), and VB0 is the potential of the bit line BL obtained before the charge redistribution. Therefore, it can be found that the potential of the bit line BL, in the case of holding the potential V1, $(=(CB \times VB0 + C \times V1)/(CB+C))$ is higher than the potential of the bit line BL, in the case of holding the potential V0, $(=(CB \times VB0 + C \times V0)/(CB+C))$ assuming that the memory cell 350 is in either of two states in which the potentials of the first terminal of the capacitor 354 are V1 and V0 (V1>V0).

Then, by comparing the potential of the bit line BL with a predetermined potential, data can be read.

As described above, the semiconductor device illustrated in FIG. 8A can hold charge that is accumulated in the capacitor 354 for a long time because the off-state current of the transistor 150 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 8B is described.

The semiconductor device illustrated in FIG. 8B includes memory cell arrays 351a and 351b including a plurality of memory cells 350 illustrated in FIG. 8A as memory circuits in an upper portion, and a peripheral circuit 353 for operating the memory cell arrays 351a and 351b in a lower portion. Note that the peripheral circuit 353 is electrically connected to the memory cell arrays 351a and 351b.

In the structure illustrated in FIG. 8B, the peripheral circuit 353 can be provided directly under the memory cell arrays 351a and 351b. Thus, the size of the semiconductor device can be decreased.

It is preferable that a semiconductor material of the transistor provided in the peripheral circuit 353 be different from that of the transistor 150. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably achieved by using the transistor.

Note that FIG. 8B illustrates, as an example, the semiconductor device in which two memory cell arrays of the memory cell arrays 351a and 351b are stacked; however, the number of memory cells to be stacked is not limited thereto. Three or more memory cells may be stacked.

Next, a specific structure of the memory cell 350 illustrated in FIG. 8A is described with reference to FIGS. 9A and 9B.

Figure 9A:
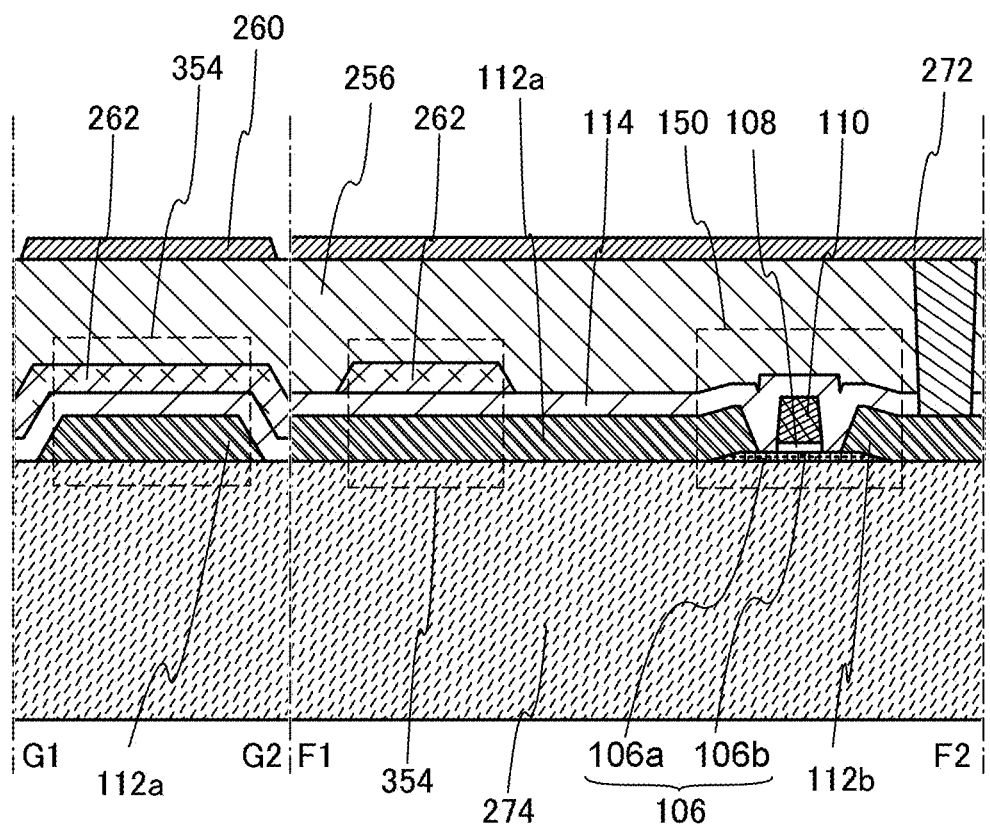
FIGS. 9A and 9B illustrate an embodiment of a semiconductor device.
Figure 9B:
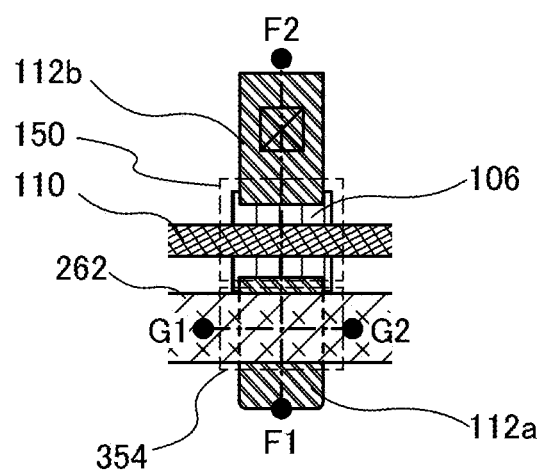

FIGS. 9A and 9B illustrate an example of a structure of the memory cell 350. FIG. 9A is a cross-sectional view of the memory cell 350, and FIG. 9B is a plan view of the memory cell 350. Here, FIG. 9A illustrates cross sections taken along line F1-F2 and line G1-G2 in FIG. 9B.

The transistor 150 in FIGS. 9A and 9B can have the same structure as the transistor in Embodiment 1.

The transistor 150 includes the oxide semiconductor film 106 which includes the region 106a and the region 106b and is formed over a base insulating film 274, the gate insulating film 108 formed over the oxide semiconductor film 106, the gate electrode 110 which is in contact with the gate insulating film 108 and overlaps with at least the oxide semiconductor film 106, and the source electrode 112a and the drain electrode 112b electrically connected to the oxide semiconductor film 106. The insulating film 114 is formed over the transistor 150.

Further, in the transistor 150, entry of impurities such as silicon into the oxide semiconductor film 106 in the vicinity of the interface with the base insulating film 274 is suppressed. As a result, in the oxide semiconductor film 106, the region 106a in which a concentration of silicon distributed from the interface with the base insulating film 274 toward an inside of the oxide semiconductor film 106 is lower than or equal to 1.0 at. %, preferably lower than or equal to 0.1 at. % is formed.

Further, a conductive layer 262 is provided in a region overlapping with the source electrode 112a of the transistor 150 with the insulating film 114 interposed therebetween; the source electrode 112a, the insulating film 114, and the conductive layer 262 constitutes the capacitor 354. That is, the source electrode 112a of the transistor 150 functions as one electrode of the capacitor 354, and the conductive layer 262 functions as the other electrode of the capacitor 354.

An insulating layer 256 having a single-layer structure or a stacked-layer structure is provided over the transistor 150 and the capacitor 354. In addition, a wiring 272 for connecting the memory cell to an adjacent memory cell is provided over the insulating layer 256. The wiring 272 is electrically connected to the drain electrode 112b of the transistor 150 through an opening which is provided in the insulating layer 256, the insulating film 114, and the like. Note that the wiring 272 and the drain electrode 112b may be directly connected to each other. The wiring 272 corresponds to the bit line BL in the circuit diagram of FIG. 8A.

In FIGS. 9A and 9B, the drain electrode 112b of the transistor 150 can also function as a source electrode of a transistor included in an adjacent memory cell. With such a planar layout, the area occupied by the semiconductor device can be reduced; thus, higher integration can be achieved.

As described above, the plurality of memory cells formed in multiple layers is each formed with a transistor including an oxide semiconductor. Since the off-state current of the transistor including an oxide semiconductor is small, stored data can be held for a long time by using such a transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, the use of a structure where the peripheral circuit and the memory circuit are stacked leads to an increase in the degree of integration of the semiconductor device.

As described above, a semiconductor device in which miniaturization and high integration are achieved and which has high electric characteristics and a method for manufacturing the semiconductor device can be provided.

This embodiment can be implemented in appropriate combination with any of the structures described in the other embodiments.

(Embodiment 5)

In this embodiment, examples of application of the semiconductor device described in any of the above embodiments to portable devices such as mobile phones, smartphones, and e-book readers will be described with reference to FIGS. 10A and 10B, FIG. 11, FIG. 12, and FIG. 13.

In portable devices such as mobile phones, smartphones, and e-book readers, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 10A:
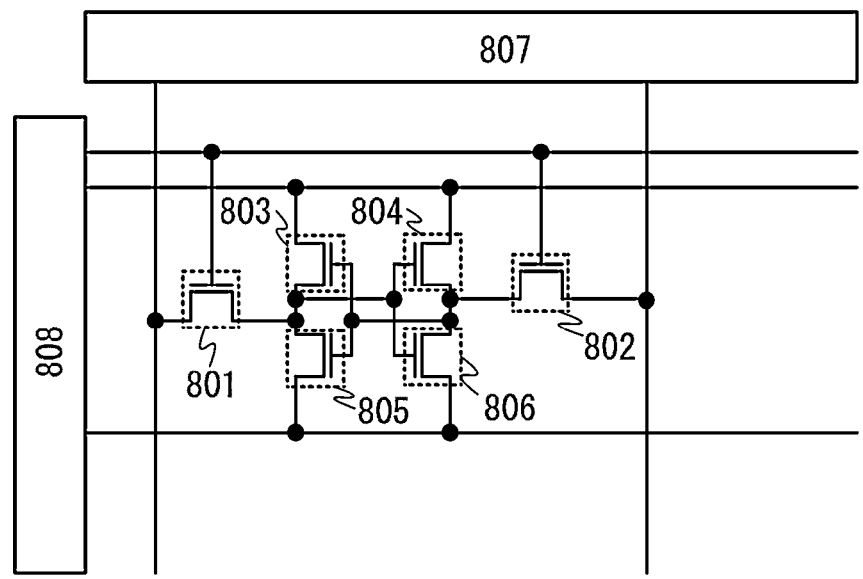
FIGS. 10A and 10B each illustrate an embodiment of a semiconductor device.

In a normal SRAM, as illustrated in FIG. 10A, one memory cell includes six transistors, which are a transistor 801, a transistor 802, a transistor 803, a transistor 804, a transistor 805, and a transistor 806, and they are driven by an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 10B:
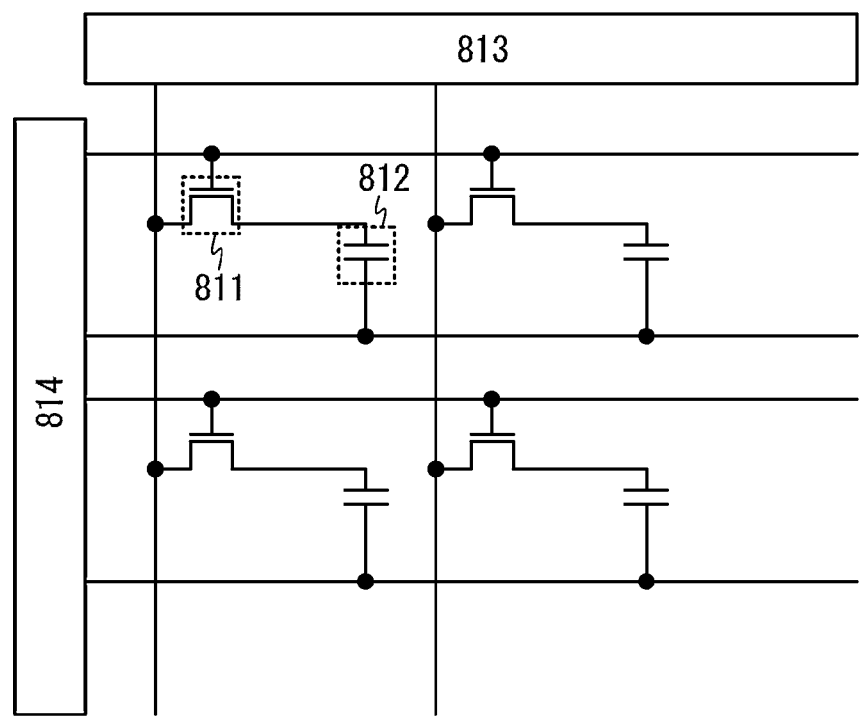

On the other hand, as illustrated in FIG. 10B, a memory cell in a DRAM includes a transistor 811 and a storage capacitor 812, which are driven by an X decoder 813 and a Y decoder 814. One cell includes one transistor and one capacitor and thus the area of a memory cell is small. The area of a memory cell of a DRAM is generally less than or equal to 10 $F^2$. Note that in the case of a DRAM, refresh operation is always necessary and power is consumed even when rewriting operation is not performed.

However, the area of the memory cell of the semiconductor device described in any of the above embodiments is about 10 $F^2$ and frequent refreshing is not needed. Therefore, the area of the memory cell is reduced, and the power consumption can be reduced.

Figure 11:
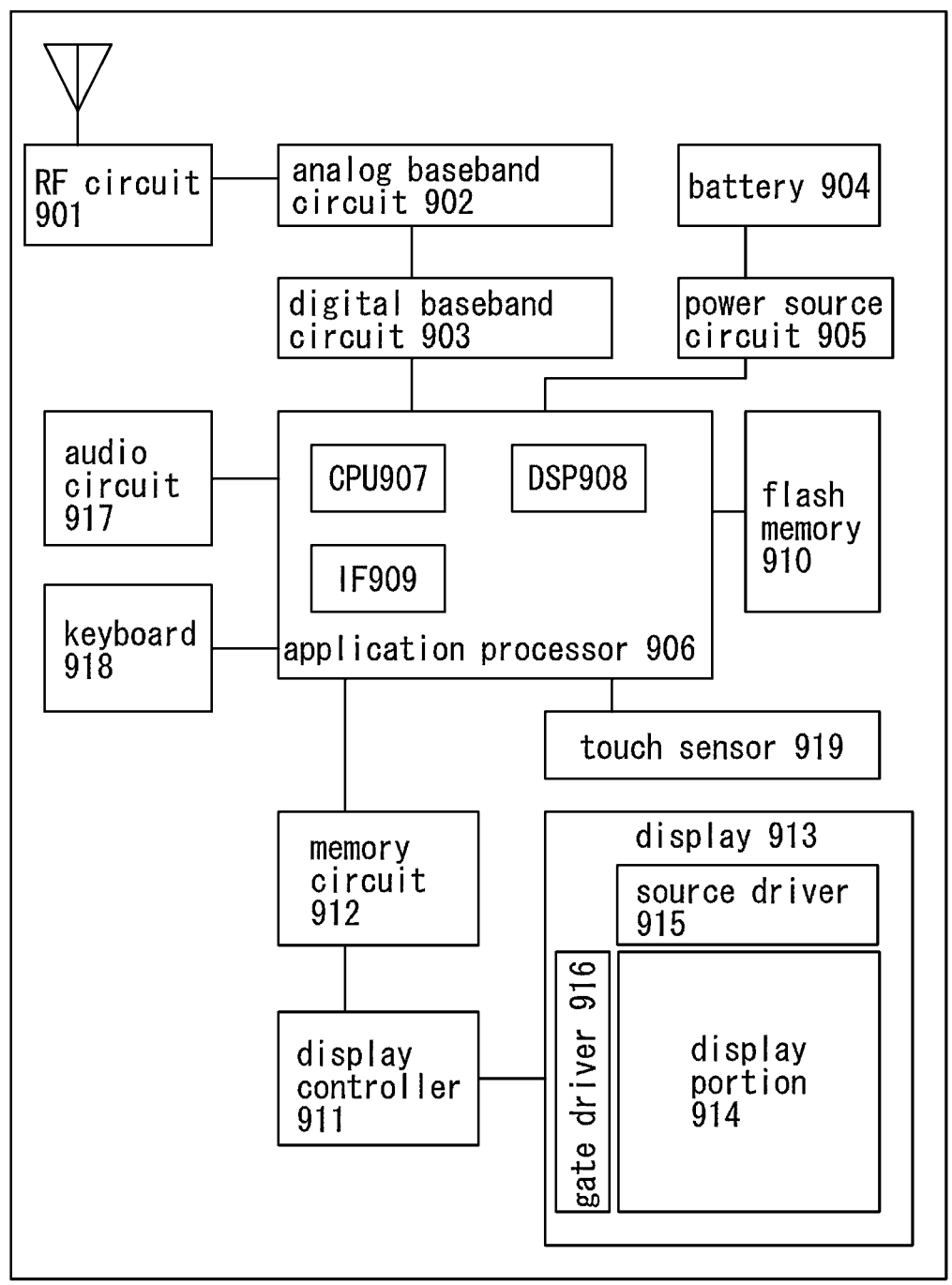
FIG. 11 illustrates an embodiment of a semiconductor device.

Next, a block diagram of a portable device is illustrated in FIG. 11. A portable device illustrated in FIG. 11 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 12:
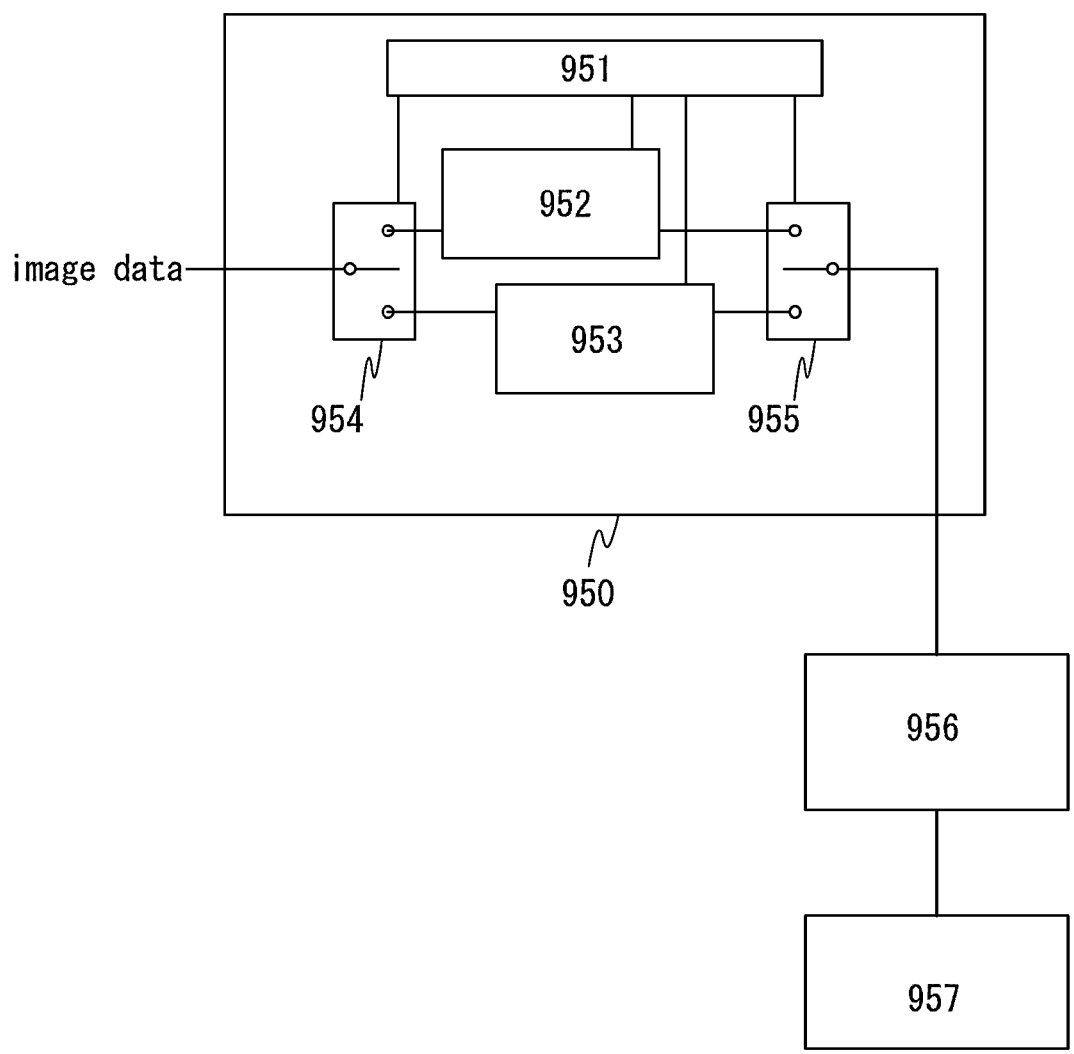
FIG. 12 illustrates an embodiment of a semiconductor device.

Next, FIG. 12 shows an example in which the semiconductor device described in any of the above embodiments is used for a memory circuit 950 in a display. The memory circuit 950 illustrated in FIG. 12 includes a memory 952, a memory 953, a switch 954, a switch 955, and a memory controller 951. Further, the memory circuit 950 is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is stored in the memory 952 though the switch 954. Then, the image data stored in the memory 952 (stored image data A) is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is stored in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 13:
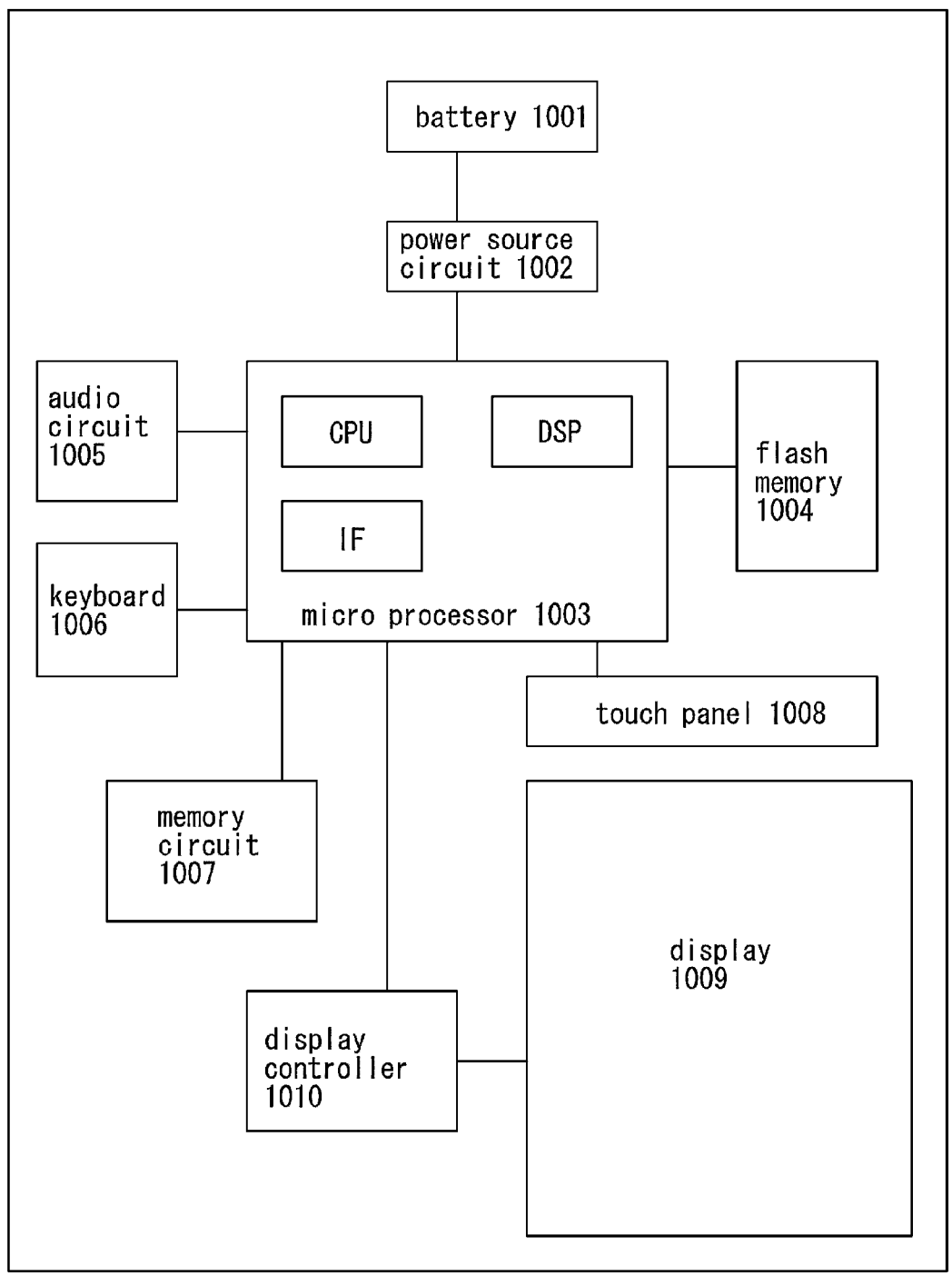
FIG. 13 illustrates an embodiment of a semiconductor device.

Next, FIG. 13 is a block diagram of an e-book reader. The e-book reader illustrated in FIG. 13 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 13. The memory circuit 1007 has a function of temporarily storing the contents of a book. For example, a user may use a highlight function. In some cases, a user wants to mark a specific portion while reading an e-book reader. This marking refers to a highlight function, and is used to make a difference from the other portions by changing the display color, underlining, making characters bold, changing the font of characters, or the like. The function makes it possible to store and hold data of a portion specified by a user. In order to store the data for a long time, the data may be copied into the flash memory 1004. Also in such a case, the semiconductor device described in any of the above embodiments is used, whereby writing and reading of data can be performed at high speed, data can be stored for a long time, and power consumption can be sufficiently reduced.

As described above, the semiconductor device in any of the above embodiments is mounted on each of the portable devices described in this embodiment. Therefore, it is possible to obtain a portable device which is capable of reading data at high speed, storing data for a long time, and reducing power consumption.

The structure, method, and the like described in this embodiment can be combined as appropriate with any of the structures, methods, and the like described in the other embodiments.

EXAMPLE 1

In this example, the characteristics of an oxide semiconductor film to which silicon (Si) was intentionally added were evaluated. The evaluation method will be described in detail below.

First, the oxide semiconductor film was formed with a sputtering apparatus. Thus, Si was intentionally added to a metal oxide target used in the sputtering apparatus. As a metal oxide target, a target in which $SiO_2$ was added to an In—Ga—Zn-based oxide (hereinafter, IGZO) was formed. In other words, an In—Ga—Zn—Si-based oxide target was formed.

In this example, three IGZO targets were used: a target A in which $SiO_2$ was added at 2 wt. % to a target with a composition where In:Ga:Zn=1:1:1 [atomic ratio]; a target B in which $SiO_2$ was added at 5 wt. % to a target with a composition where In:Ga:Zn=1:1:1 [atomic ratio]; and a target C (In:Ga:Zn=1:1:1 [atomic ratio]) to which $SiO_2$ was not added.

Note that in some cases, a thin film formed using the target A is referred to as IGZO—$SiO_x$ (2 wt. %), a thin film formed using the target B is referred to as IGZO—$SiO_x$ (5 wt. %), and a thin film formed using the target C is referred to as IGZO.

Next, thin oxide semiconductor films were formed using the target A, the target B, and the target C, and their characteristics were evaluated. For evaluation, sheet resistance, composition, and crystallinity of the obtained thin films were measured and analyzed.

(Sheet Resistance Measurement)

Samples 1 to 6 were manufactured. The sample 1 was formed in the following manner: an oxide semiconductor film was formed over a glass substrate with the use of the target C by a sputtering method under conditions that power=100 W, pressure=0.4 Pa, substrate temperature=200° C., and Ar/$O_2$=10 sccm/5 sccm ($O_2$=33%); heat treatment at 450° C. was conducted on the oxide semiconductor film in a nitrogen atmosphere for one hour; and then heat treatment at 450° C. was conducted in an oxygen atmosphere for one hour. The sample 2 was formed in the following manner: an oxide semiconductor film was formed over a glass substrate with the use of the target C by a sputtering method under conditions that power=100 W, pressure=0.4 Pa, substrate temperature=200° C., and Ar/$O_2$=0 sccm/15 sccm ($O_2$=100%); heat treatment at 450° C. was conducted on the oxide semiconductor film in a nitrogen atmosphere for one hour; and then heat treatment at 450° C. was conducted in an oxygen atmosphere for one hour. The sample 3 was formed in the following manner: an oxide semiconductor film was formed over a glass substrate with the use of the target A by a sputtering method under conditions that power=100 W, pressure=0.4 Pa, substrate temperature=200° C., and Ar/$O_2$=10 sccm/5 sccm ($O_2$=33%); heat treatment at 450° C. was conducted on the oxide semiconductor film in a nitrogen atmosphere for one hour; and then heat treatment at 450° C. was conducted in an oxygen atmosphere for one hour. The sample 4 was formed in the following manner: an oxide semiconductor film was formed over a glass substrate with the use of the target A by a sputtering method under conditions that power=100 W, pressure=0.4 Pa, substrate temperature=200° C., and Ar/$O_2$=0 sccm/15 sccm ($O_2$=100%); heat treatment at 450° C. was conducted on the oxide semiconductor film in a nitrogen atmosphere for one hour; and then heat treatment at 450° C. was conducted in an oxygen atmosphere for one hour. The sample 5 was formed in the following manner: an oxide semiconductor film was formed over a glass substrate with the use of the target B by a sputtering method under conditions that power=100 W, pressure=0.4 Pa, substrate temperature=200° C., and Ar/$O_2$=10 sccm/5 sccm ($O_2$=33%); heat treatment at 450° C. was conducted on the oxide semiconductor film in a nitrogen atmosphere for one hour; and then heat treatment at 450° C. was conducted in an oxygen atmosphere for one hour. The sample 6 was formed in the following manner: an oxide semiconductor film was formed over a glass substrate with the use of the target B by a sputtering method under conditions that power=100 W, pressure=0.4 Pa, substrate temperature=200° C., and Ar/$O_2$=0 sccm/15 sccm ($O_2$=100%); heat treatment at 450° C. was conducted on the oxide semiconductor film in a nitrogen atmosphere for one hour; and then heat treatment at 450° C. was conducted in an oxygen atmosphere for one hour.

The thickness of each of the oxide semiconductor films in the samples 1 to 6 was 100 nm. The deposition conditions of the manufactured samples, structures thereof, and the like are shown in Table 1.

TABLE 1

|  | Target | Deposition Condition | Sample Structure | Heat Treatment |
|---|---|---|---|---|
| Sample 1 | Target C | Ar/O2 = 10 sccm/5 sccm ($O_2$ = 33%) | Glass\IGZO = 100 nm | 450° C. |
| Sample 2 | Target C | Ar/$O_2$ = 0 sccm/15 sccm ($O_2$ = 100%) | Glass\IGZO = 100 nm | 450° C. |
| Sample 3 | Target A | Ar/O2 = 10 sccm/5 sccm ($O_2$ = 33%) | Glass\IGZO—$SiO_x$ (2 wt %) = 100 nm | 450° C. |
| Sample 4 | Target A | Ar/$O_2$ = 0 sccm/15 sccm ($O_2$ = 100%) | Glass\IGZO—$SiO_x$ (2 wt %) = 100 nm | 450° C. |
| Sample 5 | Target B | Ar/$O_2$ = 10 sccm/5 sccm ($O_2$ = 33%) | Glass\IGZO—$SiO_x$ (5 wt %) = 100 nm | 450° C. |
| Sample 6 | Target B | Ar/$O_2$ = 0 sccm/15 sccm ($O_2$ = 100%) | Glass\IGZO—$SiO_x$ (5 wt %) = 100 nm | 450° C. |

Figure 22:
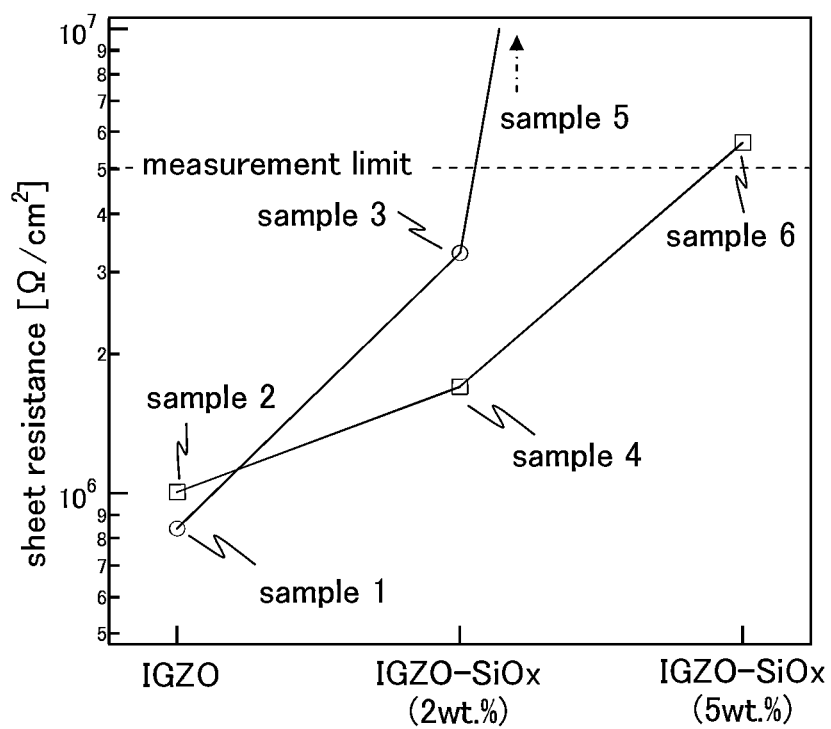
FIG. 22 is a diagram showing measurement results in an example of the present invention.

Next, sheet resistance of the samples 1 to 6 was measured. Note that for sheet resistance measurement, a sheet resistance measurement system was used. FIG. 22 shows measurement results of sheet resistance of the samples 1 to 6. In FIG. 22, the horizontal axis indicates objects (formed thin films), and the vertical axis indicates sheet resistance.

As can be seen from FIG. 22, sheet resistance of thin films is increased by adding Si to IGZO. In particular, the sheet resistance of the sample 5 exceeded the measurement upper limit ($5 \times 10^5$ $\Omega/cm^2$) of the measurement system and thus it was impossible to measure the sheet resistance value. Note that although the sheet resistance of the sample 6 also exceeded the measurement upper limit of the measurement system, the value around the upper limit of the measurement system was calculated in principle. However, the value exceeding the upper limit of the measurement system is not always measured accurately.

(Composition Analysis)

Samples 7 and 8 were manufactured. The sample 7 was formed in the following manner: an oxide semiconductor film was formed over a glass substrate with the use of the target A by a sputtering method under conditions that power=100 W, pressure=0.4 Pa, substrate temperature=200° C., and Ar/$O_2$=0 sccm/15 sccm ($O_2$=100%). The sample 8 was formed in the following manner: an oxide semiconductor film was formed over a glass substrate with the use of the target B by a sputtering method under conditions that power=100 W, pressure=0.4 Pa, substrate temperature=200° C., and Ar/$O_2$=0 sccm/15 sccm ($O_2$=100%).

The thickness of each of the oxide semiconductor films in the samples 7 and 8 was 100 nm.

Next, composition analysis was performed on the samples 7 and 8. For composition analysis, X-ray photoelectron spectroscopy (XPS) was used. XPS is a measurement method by which photoelectron energy generated by irradiating a surface of a sample with an X-ray is measured, so that a constituent element of the sample and the electron state thereof can be analyzed. Table 2 shows deposition conditions, structures, and composition analysis of the samples 7 and 8.

TABLE 2

|  | Target | Deposition Condition | Sample Structure | Composition Analysis Result [unit: at. %] | | | | |
|---|---|---|---|---|---|---|---|---|
|  |  |  |  | In | Ga | Zn | O | Si |
| Sample 7 | Target A | Ar/$O_2$ = 0 sccm/15 sccm ($O_2$ = 100%) | Glass\IGZO—$SiO_x$ (2 wt %) = 100 nm | 18.0 | 15.3 | 4.6 | 61.0 | 1.1 |
| Sample 8 | Target B | Ar/$O_2$ = 0 sccm/15 sccm ($O_2$ = 100%) | Glass\IGZO—$SiO_x$ (5 wt %) = 100 nm | 16.7 | 14.4 | 4.3 | 62.0 | 2.6 |

According to Table 2, the sample 7 formed with the use of the target A has such composition that In =18.0 (at. %), Ga=15.3 (at. %), Zn=4.6 (at. %), 0=61.0 (at. %), and Si=1.1 (at. %); the sample 8 formed with the use of the target B has such composition that In =16.7 (at. %), Ga=14.4 (at. %), Zn=4.3 (at. %), O=62.0 (at. %), and Si=2.6 (at. %).

(Crystallinity Analysis)

Samples 9 to 14 were manufactured. The sample 9 was formed in the following manner: an oxide semiconductor film was formed over a glass substrate with the use of the target A by a sputtering method under conditions that power=100 W, pressure=0.4 Pa, substrate temperature=200° C., and Ar/$O_2$=0 sccm/15 sccm ($O_2$=100%). The sample 10 was formed in the following manner: an oxide semiconductor film was formed over a glass substrate with the use of the Target A by a sputtering method under conditions that power=100 W, pressure=0.4 Pa, substrate temperature=200° C., and Ar/$O_2$=0 sccm/15 sccm ($O_2$=100%); heat treatment at 450° C. was conducted on the oxide semiconductor film in a nitrogen atmosphere for one hour; and then heat treatment at 450° C. was conducted in an oxygen atmosphere for one hour. The sample 11 was formed in the following manner: an oxide semiconductor film was formed over a glass substrate with the use of the target A by a sputtering method under conditions that power=100 W, pressure=0.4 Pa, substrate temperature=200° C., and Ar/$O_2$=0 sccm/15 sccm ($O_2$=100%); heat treatment at 650° C. was conducted on the oxide semiconductor film in a nitrogen atmosphere for one hour; and then heat treatment at 650° C. was conducted in an oxygen atmosphere for one hour. The sample 12 was formed in the following manner: an oxide semiconductor film was formed over a glass substrate with the use of the target B by a sputtering method under conditions that power=100 W, pressure=0.4 Pa, substrate temperature=200° C., and Ar/$O_2$=0 sccm/15 sccm ($O_2$=100%). The sample 13 was formed in the following manner: an oxide semiconductor film was formed over a glass substrate with the use of the target B by a sputtering method under conditions that power=100 W, pressure=0.4 Pa, substrate temperature=200° C., and Ar/$O_2$=0 sccm/15 sccm ($O_2$=100%); heat treatment at 450° C. was conducted on the oxide semiconductor film in a nitrogen atmosphere for one hour; and then heat treatment at 450° C. was conducted in an oxygen atmosphere for one hour. The sample 14 was formed in the following manner: an oxide semiconductor film was formed over a glass substrate with the use of the target B by a sputtering method under conditions that power=100 W, pressure=0.4 Pa, substrate temperature=200° C., and Ar/$O_2$=0 sccm/15 sccm ($O_2$=100%); heat treatment at 650° C. was conducted on the oxide semiconductor film in a nitrogen atmosphere for one hour; and then heat treatment at 650° C. was conducted in an oxygen atmosphere for one hour.

The thickness of each of the oxide semiconductor films in the samples 9 to 14 was 100 nm Table 3 shows deposition conditions of the manufactured samples, structures thereof, and the like. Note that the samples 9 to 11 are oxide semiconductor films each of which has composition similar to that of the sample 7, and the samples 12 to 14 are oxide semiconductor films each of which has composition similar to that of the sample 8.

TABLE 3

| | Target | Deposition Condition | Sample Structure | Heat Treatment |
|---|---|---|---|---|
| Sample 9 | Target A | Ar/$O_2$ = 0 sccm/15 sccm ($O_2$ = 100%) | Glass\IGZO—$SiO_x$ (2 wt %) = 100 nm | No |
| Sample 10 | Target A | Ar/$O_2$ = 0 sccm/15 sccm ($O_2$ = 100%) | Glass\IGZO—$SiO_x$ (2 wt %) = 100 nm | 450° C. |
| Sample 11 | Target A | Ar/$O_2$ = 0 sccm/15 sccm ($O_2$ = 100%) | Glass\IGZO—$SiO_x$ (2 wt %) = 100 nm | 650° C. |
| Sample 12 | Target B | Ar/$O_2$ = 0 sccm/15 sccm ($O_2$ = 100%) | Glass\IGZO—$SiO_x$ (5 wt %) = 100 nm | No |
| Sample 13 | Target B | Ar/$O_2$ = 0 sccm/15 sccm ($O_2$ = 100%) | Glass\IGZO—$SiO_x$ (5 wt %) = 100 nm | 450° C. |
| Sample 14 | Target B | Ar/$O_2$ = 0 sccm/15 sccm ($O_2$ = 100%) | Glass\IGZO—$SiO_x$ (5 wt %) = 100 nm | 650° C. |

Figure 23A:
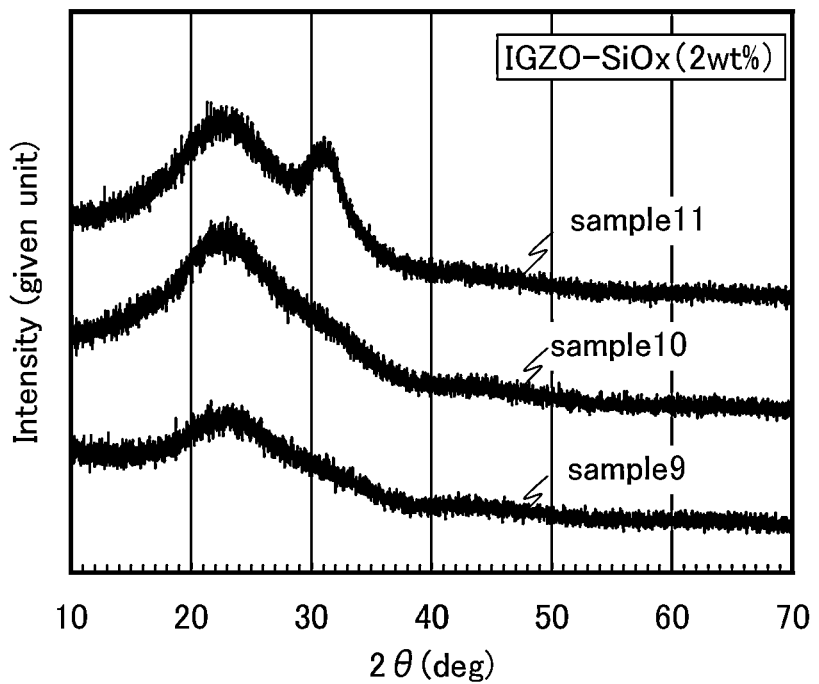
FIGS. 23A and 23B are diagrams showing measurement results in an example of the present invention.

Next, crystallinity of the samples 9 to 14 was analyzed. For analysis of crystallinity, X-ray diffraction (XRD) was used. XRD is a phenomenon in which an X-ray is diffracted at a crystal lattice, so that crystallinity of a sample for measurement can be measured. FIG. 23A shows crystallinity analysis results of the samples 9 to 11, and FIG. 23B shows crystallinity analysis results of the samples 12 to 14.

As can be seen from FIG. 23A showing analysis results of the samples 9 to 11 formed with the use of the target A, the sample 9 on which heat treatment was not performed and the sample 10 on which heat treatment at 450° C. was performed have no diffraction peak showing definite crystallinity. On the other hand, in the case of the sample 11 on which heat treatment at 650° C. was performed, a diffraction peak showing crystallinity is observed around at 2θ=31°.

Figure 23B:
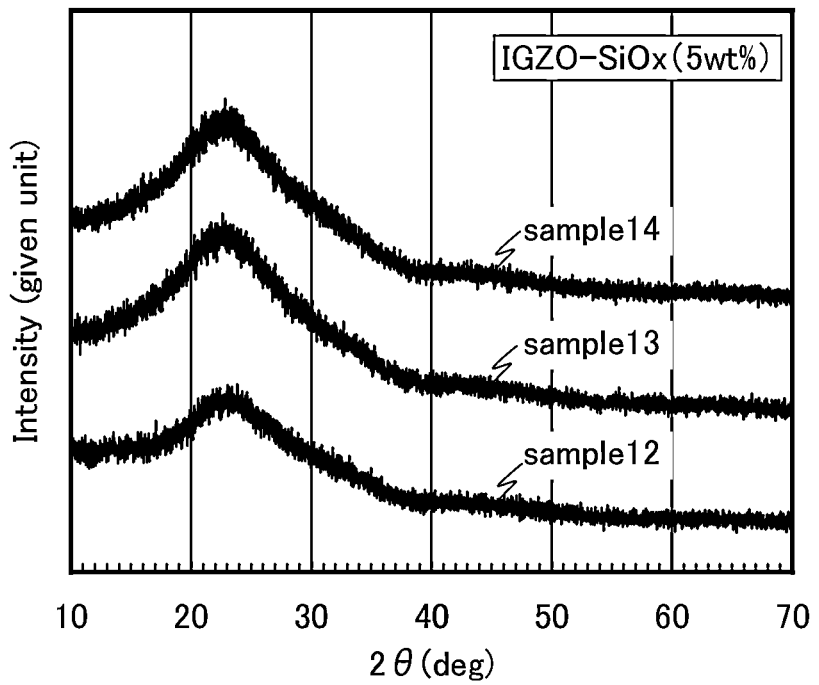

Further, as can be seen from FIG. 23B showing analysis results of the samples 12 to 14 formed with the use of the target B, a diffraction peak showing definite crystallinity is not observed in any of the sample 12 on which heat treatment was not performed, the sample 13 on which heat treatment at 450° C. was performed, and the sample 14 on which heat treatment at 650° C. was performed.

According to the above results, in each of the samples 9 to 11 formed with the use of the target A, the concentration of silicon (Si) in the oxide semiconductor film is 1.1 at. %; in each of the samples 12 to 14 formed with the use of the target B, the concentration of silicon (Si) in the oxide semiconductor film is 2.6 at. %. As a result, it is found that crystallization of the oxide semiconductor film is inhibited when the concentration of Si in the oxide semiconductor film is high.

EXAMPLE 2

The above embodiment describes that entry of a constituent element of a base insulating film into an oxide semiconductor film is caused by mixing occurring in deposition of the oxide semiconductor film. However, as another cause, it can be considered that a constituent element of a base insulating film diffuses into the oxide semiconductor film by heating a substrate after deposition of the oxide semiconductor film. Thus, in this example, experiment for examining whether entry of a constituent element of a base insulating film into an oxide semiconductor film is caused by thermal diffusion will be described.

In the experiment, first, three substrates over each of which a base insulating film and an oxide semiconductor film were formed were prepared. Then, a sample which was not subjected to heat treatment (sample 15), a sample which was subjected to heat treatment at 450° C. (sample 16), and a sample which was subjected to heat treatment at 650° C. (sample 17) were manufactured. After that, in each sample, the concentration of silicon in the oxide semiconductor film in the vicinity of an interface with the base insulating film was measured by time-of-flight secondary ion mass spectrometry (ToF-SIMS).

Figure 24:
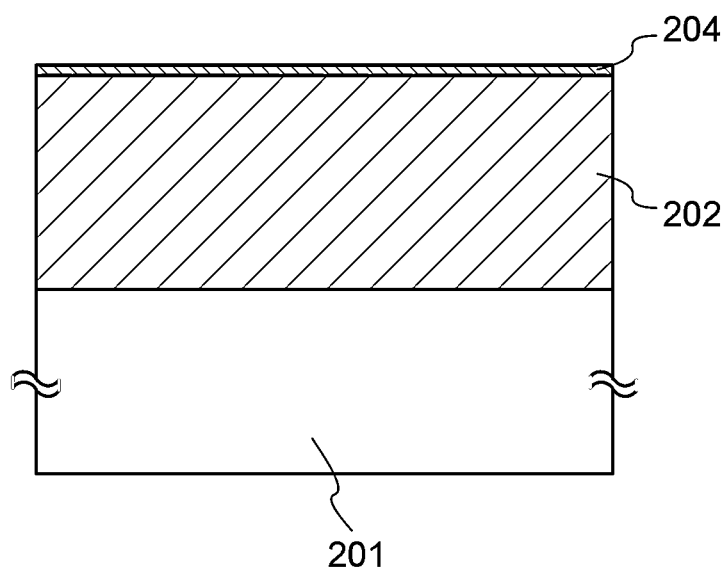
FIG. 24 illustrates a structure of a sample according to an example of the present invention.

A structure of the samples 15 to 17 used for ToF-SIMS measurement is illustrated in FIG. 24.

The sample illustrated in FIG. 24 was obtained by depositing a silicon oxide film 202 as a base insulating film over a silicon substrate 201, improving planarity of a surface with the use of a chemical mechanical polishing (CMP) apparatus, and depositing an IGZO film 204.

The silicon oxide film 202 was deposited with a sputtering apparatus. The conditions for depositing the silicon oxide film 202 were as follows: substrate temperature, 100° C.; gas flow rate, Ar/$O_2$=25 sccm/25 sccm; deposition power, 1.5 kW (RF power supply); deposition pressure, 0.4 Pa; and thickness, 300 nm. As a sputtering target, a silicon oxide target was used. Note that before the silicon oxide film 202 was formed, an oxide film formed over the surface of the silicon substrate 201 was removed using diluted hydrofluoric acid.

The IGZO film 204 was deposited with a sputtering apparatus. The conditions for depositing the IGZO film 204 were as follows: substrate temperature, 200° C.; gas flow rate, Ar/$O_2$=30 sccm/15 sccm; deposition power, 0.5 kW (DC power supply); deposition pressure, 0.4 Pa; and thickness, 15 nm Note that as a sputtering target, an oxide target of In:Ga:Zn=3:1:2 [atomic ratio] was used.

The substrate was introduced into an electric furnace using a resistance heater or the like, and then the heat treatment was performed. The heat treatment conditions of the sample 16 were as follows: heating temperature, 450° C.; and heating time, one hour. The heat treatment conditions of the sample 17 were as follows: heating temperature, 650° C.; and heating time, one hour. Note that the heating atmosphere of both samples was a mixed atmosphere of nitrogen and oxygen. The sample 15 was not subjected to heat treatment.

Figure 25:
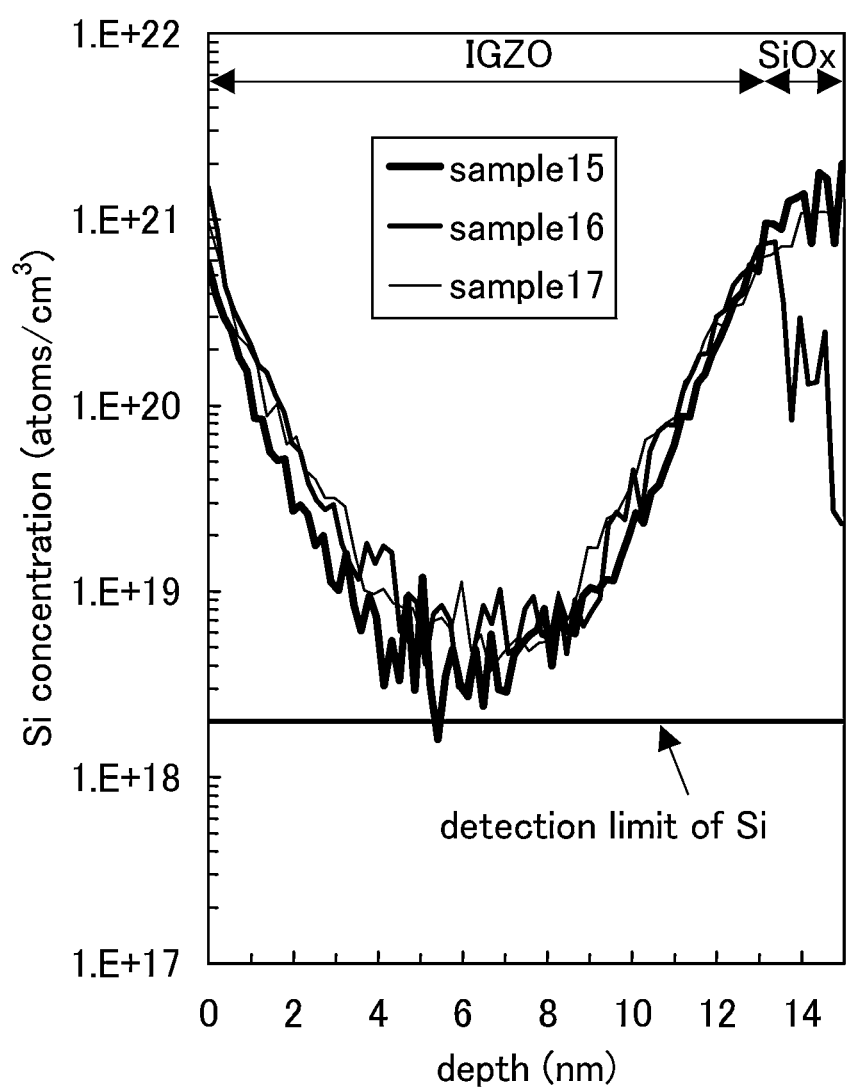
FIG. 25 is a diagram showing measurement results in an example of the present invention.

Next, the samples 15 to 17 were subjected to ToF-SIMS measurement from the substrate surface side (on the IGZO film 204 side), so that the concentration of silicon in the IGZO film 204 in the vicinity of the interface with the silicon oxide film 202 was measured. FIG. 25 shows results thereof.

In FIG. 25, the horizontal axis indicates the depth (nm) and the vertical axis indicates the silicon (Si) concentration (atoms/cm$^3$). Further, in FIG. 25, $SiO_x$ indicates the silicon oxide film 202 and IGZO indicates the IGZO film 204.

By comparing the sample 15 which was not subjected to heat treatment, the sample 16 which was subjected to heat treatment, and the sample 17 which was subjected to heat treatment, as seen in FIG. 25, a significant difference of the inclination of the concentration of silicon (also referred to as silicon concentration gradient) in the IGZO film in the vicinity of the interface with the silicon oxide film is not observed. Thus, it can be said that entry of a constituent element of the base insulating film into the oxide semiconductor film is caused not by thermal diffusion but by mixing.

EXAMPLE 3

An experiment was conducted to examine whether entry of a constituent element of a base insulating film into an oxide semiconductor film, which is caused by mixing, can be suppressed by decreasing the power for depositing the oxide semiconductor film. In this example, the experiment will be described.

In the experiment, four samples were manufactured in the following manner: first, base insulating films were formed over substrates; four oxide semiconductor films were deposited over the respective base insulating films with different power conditions (1 kW, 5 kW, 9 kW, and (1 kW+5 kW)); and heat treatment was performed on each substrate. Then, the concentration of silicon in the oxide semiconductor film in the vicinity of an interface with the base insulating film of each sample was measured by a ToF-SIMS method.

Figure 26:
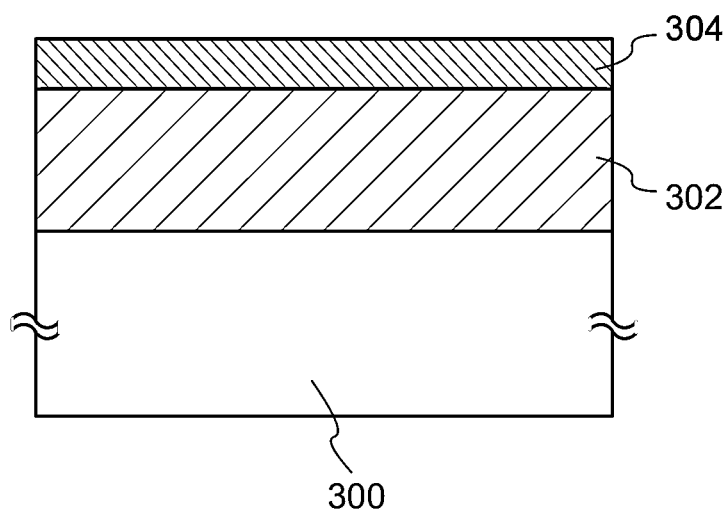
FIG. 26 illustrates a structure of a sample according to an example of the present invention.

FIG. 26 illustrates a structure of the samples used for ToF-SIMS measurement.

The sample illustrated in FIG. 26 was obtained by depositing a silicon oxynitride film 302 as a base insulating film over a glass substrate 300, depositing an IGZO film 304, and performing heat treatment.

The silicon oxynitride film 302 was deposited with the use of a plasma CVD apparatus. The conditions for depositing the silicon oxynitride film 302 were as follows: substrate temperature, 325° C.; gas flow rate, $SiH_4/N_2O/Ar$=250 sccm/2500 sccm/2500 sccm; deposition power, 5 kW (with four power sources each with a frequency of 2.45 GHz); deposition pressure, 30 Pa; and thickness, 100 nm. Note that the surface of the glass substrate 300 was cleaned to remove particles and the like before formation of the silicon oxynitride film 302.

The IGZO film 304 was deposited with the use of a sputtering apparatus. The conditions for depositing the IGZO film 304 were as follows: substrate temperature, 170° C.; gas flow rate, $Ar/O_2$=100 sccm/100 sccm; deposition pressure, 0.6 Pa; thickness, 35 nm; and deposition power, four conditions of 1 kW, 5 kW, 9 kW, and (1 kW+5 kW) (an AC power source was used for each sample). Note that as a sputtering target, an oxide target of In:Ga:Zn=1:1:1 [atomic ratio] was used.

Note that the above deposition power "1 kW+5 kW" means that a power of 1 kW was used for a 5-nm-thick film deposition and then a power of 5 kW was used for a 30-nm-thick film deposition. Hereinafter, a sample in which an oxide semiconductor film was deposited with 9 kW is referred to as a sample 18, a sample in which an oxide semiconductor film was deposited with 5 kW is referred to as a sample 19, a sample in which an oxide semiconductor film was deposited with 1 kW is referred to as a sample 20, and a sample in which an oxide semiconductor film was deposited with (1 kW+5 kW) is referred to as a sample 21.

The substrates were introduced into an electric furnace using a resistance heater or the like, and heat treatment was performed. The heat treatment was performed first for one hour at a temperature of 450° C. in an $N_2$ atmosphere, and then performed for one hour at a temperature of 650° C. in a ($N_2$+$O_2$) atmosphere.

Figure 27A:
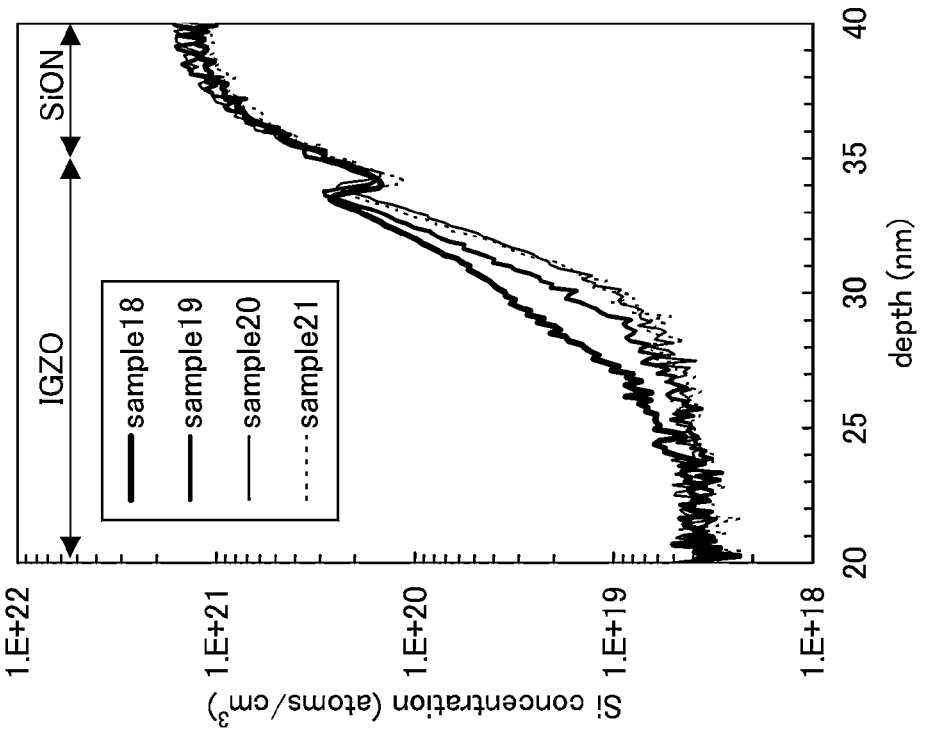
FIGS. 27A and 27B are diagrams showing measurement results in an example of the present invention.
Figure 27B:
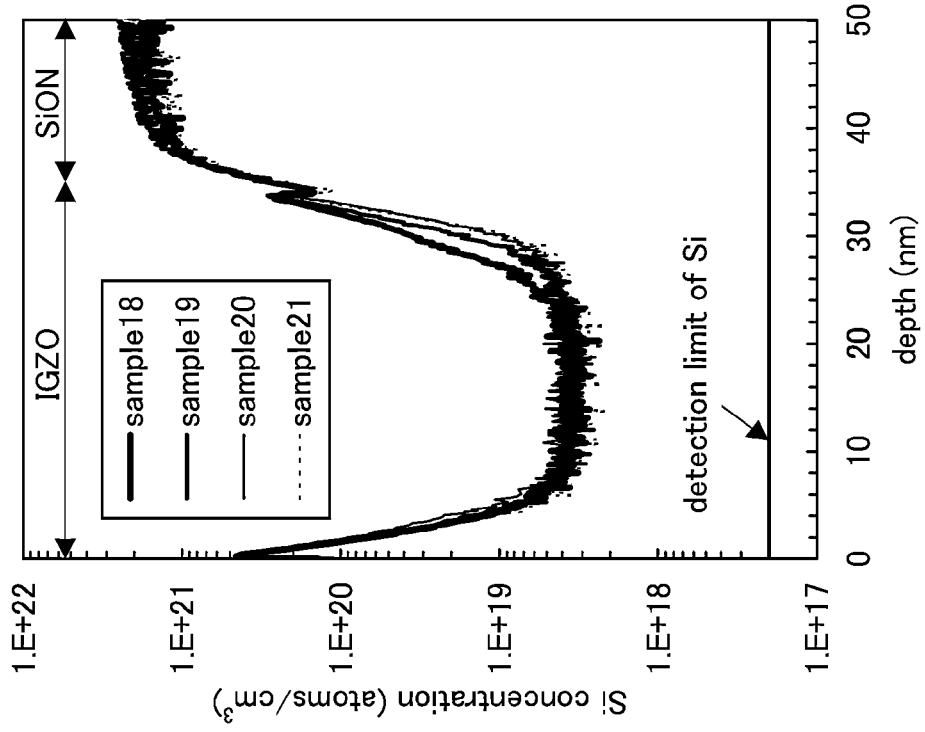

Next, the samples 18 to 21 were subjected to ToF-SIMS measurement from the substrate surface side (the IGZO film 304 side) to measure the concentration of silicon in the IGZO film 304 in the vicinity of an interface with the silicon oxynitride film 302. The results are shown in FIGS. 27A and 27B. Note that FIG. 27B shows part of FIG. 27A which is enlarged.

In FIGS. 27A and 27B, the horizontal axis indicates the depth (nm) and the vertical axis indicates the silicon (Si) concentration (atoms/cm$^3$). Further, in FIGS. 27A and 27B, SiON indicates the silicon oxynitride film 302 and IGZO indicates the IGZO film 304.

In addition, as can be seen from FIGS. 27A and 27B, the concentration of silicon in the IGZO film in the vicinity of the interface with the silicon oxynitride film tends to decrease as the deposition power is decreased. According to the above, entry of a constituent element of the base insulating film into the oxide semiconductor film, which is caused by mixing, can be suppressed by decreasing the power for depositing the oxide semiconductor film. Note that the lower detection limit of Si in FIG. 25 of Example 2 is different from that in FIGS. 27A and 27B of this example by approximately an order of magnitude because the standard samples used in respective measurements are different.

Furthermore, the silicon concentrations of the sample 20 and the sample 21 are substantially the same, which indicates that entry of a constituent element of the base insulating film into the oxide semiconductor film, which is caused by mixing, can be suppressed even when deposition of the oxide semiconductor film is performed with a low power in the initial stage and then the rest of deposition is performed with the increased power.

This application is based on Japanese Patent Application serial no. 2011-235636 filed with Japan Patent Office on Oct. 27, 2011, the entire contents of which are hereby incorporated by reference.

What is claimed is:
1. A semiconductor device comprising:
an insulating film including silicon;
an oxide semiconductor layer over the insulating film;
a gate insulating film over the oxide semiconductor layer;
a gate electrode over the gate insulating film;
a source electrode electrically connected to the oxide semiconductor layer; and a drain electrode electrically connected to the oxide semiconductor layer,
wherein the oxide semiconductor layer comprises:
  a first region in contact with the insulating film; and
  a second region over the first region,
wherein a concentration of silicon distributed in the first region is lower than or equal to 1.0 at. %, and
wherein the first region includes a first crystal portion.

2. The semiconductor device according to claim 1, wherein a thickness of the first region is less than or equal to 5 nm.

3. The semiconductor device according to claim 1, wherein the insulating film further includes oxygen.

4. The semiconductor device according to claim 1, wherein at least part of silicon in the insulating film is bonded to oxygen.

5. The semiconductor device according to claim 1, wherein the oxide semiconductor layer comprises a second crystal portion in the second region.

6. The semiconductor device according to claim 5, wherein a c-axis in at least one of the first crystal portion and the second crystal portion is aligned in a direction substantially parallel to a normal vector of a surface of the insulating film.

7. The semiconductor device according to claim 1, wherein a silicon concentration of the first region is lower than or equal to 0.1 at. %.

8. The semiconductor device according to claim 1, wherein a carbon concentration of the first region is lower than or equal to $1.0 \times 10^{20}$ atoms/cm$^3$.

9. A semiconductor device comprising:
  a base insulating film including silicon;
  an oxide semiconductor film over the base insulating film;
  a gate insulating film over the oxide semiconductor film;
  a gate electrode overlapping with the oxide semiconductor film; and
  a source electrode and a drain electrode electrically connected to the oxide semiconductor film,
wherein the oxide semiconductor film comprises a first region in which a concentration of silicon distributed from an interface with the base insulating film toward an inside of the oxide semiconductor film is lower than or equal to 1.0 at. %, and
wherein at least the first region comprises a first crystal portion.

10. The semiconductor device according to claim 9, wherein the first region is formed to be in contact with the interface with the base insulating film and have a thickness less than or equal to 5 nm.

11. The semiconductor device according to claim 9, wherein the base insulating film further includes oxygen.

12. The semiconductor device according to claim 9, wherein at least part of silicon in the base insulating film is bonded to oxygen.

13. The semiconductor device according to claim 9, wherein the oxide semiconductor film comprises a second crystal portion in a second region.

14. The semiconductor device according to claim 13, wherein a c-axis in at least one of the first crystal portion and the second crystal portion is aligned in a direction substantially parallel to a normal vector of a surface of the base insulating film.

15. The semiconductor device according to claim 9, wherein a silicon concentration of the first region is lower than or equal to 0.1 at. %.

16. The semiconductor device according to claim 9, wherein a carbon concentration of the first region is lower than or equal to $1.0 \times 10^{20}$ atoms/cm$^3$.

* * * * *